(12) United States Patent
Kim et al.

(10) Patent No.: US 11,430,795 B2
(45) Date of Patent: Aug. 30, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Hyewon Kim, Hwaseong-si (KR); Eunjung Kim, Daegu (KR); Geumjung Seong, Seoul (KR); Jay-Bok Choi, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/192,069

(22) Filed: Mar. 4, 2021

(65) Prior Publication Data
US 2022/0028868 A1 Jan. 27, 2022

(30) Foreign Application Priority Data
Jul. 24, 2020 (KR) .................. 10-2020-0092328

(51) Int. Cl.
*H01L 27/108* (2006.01)
*H01L 21/762* (2006.01)

(52) U.S. Cl.
CPC .. *H01L 27/10897* (2013.01); *H01L 21/76229* (2013.01); *H01L 21/76232* (2013.01); *H01L 27/10847* (2013.01); *H01L 27/10814* (2013.01); *H01L 27/10823* (2013.01)

(58) Field of Classification Search
CPC ......... H01L 27/10897; H01L 21/76229; H01L 21/76232; H01L 27/10847; H01L 27/10814; H01L 27/10823; H01L 27/10876; H01L 27/10894
See application file for complete search history.

(56) References Cited

U.S. PATENT DOCUMENTS

| | | | |
|---|---|---|---|
| 7,179,717 B2 | 2/2007 | Sandhu et al. | |
| 7,396,738 B1 | 7/2008 | Lee | |
| 7,427,552 B2 | 9/2008 | Jin et al. | |
| 7,468,302 B2 | 12/2008 | Shin | |

(Continued)

FOREIGN PATENT DOCUMENTS

| | | | | |
|---|---|---|---|---|
| CN | 105355587 B | 9/2018 | | |
| CN | 112786597 A | * 5/2021 | ....... | H01L 29/42372 |

(Continued)

*Primary Examiner* — Edward Chin
(74) *Attorney, Agent, or Firm* — Lee IP Law, P.C.

(57) ABSTRACT

A semiconductor device includes a substrate including a cell region, a peripheral region, and a boundary region therebetween, a cell device isolation pattern on the cell region of the substrate to define cell active patterns, a peripheral device isolation pattern on the peripheral region of the substrate to define peripheral active patterns, and an insulating isolation pattern on the boundary region of the substrate, the insulating isolation pattern being between the cell active patterns and the peripheral active patterns, wherein a bottom surface of the insulating isolation pattern includes a first edge adjacent to a side surface of a corresponding one of the cell active patterns, and a second edge adjacent to a side surface of a corresponding one of the peripheral active patterns, the first edge being at a height lower than the second edge, when measured from a bottom surface of the substrate.

20 Claims, 24 Drawing Sheets

(56) References Cited

U.S. PATENT DOCUMENTS

| | | |
|---|---|---|
| 9,281,362 B2 | 3/2016 | Lee et al. |
| 2014/0167206 A1 | 6/2014 | Wu et al. |
| 2018/0166321 A1* | 6/2018 | Sun .................. H01L 21/31144 |
| 2019/0214391 A1* | 7/2019 | Yoon ................. H01L 27/10823 |
| 2019/0287849 A1 | 9/2019 | Wiseman et al. |
| 2020/0043920 A1* | 2/2020 | Yoo .................. H01L 21/76232 |
| 2021/0118886 A1* | 4/2021 | Choi ................. H01L 27/10894 |
| 2021/0143261 A1* | 5/2021 | Huang ................. H01L 29/513 |
| 2021/0175236 A1* | 6/2021 | Shih .................. H01L 27/10873 |
| 2021/0366905 A1* | 11/2021 | Yoo .................. H01L 29/66545 |

FOREIGN PATENT DOCUMENTS

| | | |
|---|---|---|
| KR | 10-2019-0109187 A | 9/2019 |
| WO | WO 2015/074621 A1 | 5/2015 |

\* cited by examiner

SEMICONDUCTOR DEVICE AND METHOD OF FABRICATING THE SAME

CROSS-REFERENCE TO RELATED APPLICATION

Korean Patent Application No. 10-2020-0092328, filed on Jul. 24, 2020, in the Korean Intellectual Property Office, and entitled: "Semiconductor Device and Method of Fabricating the Same," is incorporated by reference herein in its entirety.

BACKGROUND

1. Field

The present disclosure relates to a semiconductor device and a method of fabricating the same, and in particular, to a semiconductor device including active patterns, which are formed by patterning a substrate, and a method of fabricating the same.

2. Description of the Related Art

A semiconductor device may include cell transistors, which constitute a memory cell array, and peripheral transistors, which constitute a peripheral circuit to operate the memory cell array. The cell transistors and the peripheral transistors may be disposed on a semiconductor substrate, and the semiconductor substrate may include cell active patterns, on which the cell transistors are formed, and peripheral active patterns, on which the peripheral transistors are formed. The cell active patterns are defined by cell device isolation patterns interposed therebetween, and the peripheral active patterns are defined by peripheral device isolation patterns interposed therebetween.

SUMMARY

According to embodiments, a semiconductor device may include a substrate including a cell region, a peripheral region, and a boundary region therebetween, a cell device isolation pattern disposed on the cell region of the substrate to define cell active patterns, a peripheral device isolation pattern disposed on the peripheral region of the substrate to define peripheral active patterns, and an insulating isolation pattern disposed on the boundary region of the substrate and between the cell active patterns and the peripheral active patterns. A bottom surface of the insulating isolation pattern may include a first edge adjacent to a side surface of a corresponding one of the cell active patterns and a second edge adjacent to a side surface of a corresponding one of the peripheral active patterns. The first edge may be located at a height lower than the second edge, when measured from a bottom surface of the substrate.

According to embodiments, a semiconductor device may include a substrate including a cell region, a peripheral region, and a boundary region therebetween, cell active patterns disposed on the cell region of the substrate to protrude from the substrate, peripheral active patterns disposed on the peripheral region of the substrate to protrude from the substrate, and an insulating isolation pattern disposed on the boundary region of the substrate and between the cell active patterns and the peripheral active patterns. The insulating isolation pattern may be interposed between a corresponding one of the cell active patterns and a corresponding one of the peripheral active patterns. A bottom surface of the insulating isolation pattern may include a first edge adjacent to a side surface of the corresponding cell active pattern and a second edge adjacent to a side surface of the corresponding peripheral active pattern. A height of the bottom surface of the insulating isolation pattern may be lowered with decreasing distance to the first edge, when measured from a bottom surface of the substrate.

According to embodiments, a semiconductor device may include a substrate including a cell region, a peripheral region, and a boundary region therebetween, a cell device isolation pattern disposed on the cell region of the substrate to define cell active patterns, a peripheral device isolation pattern disposed on the peripheral region of the substrate to define peripheral active patterns, and an insulating isolation pattern disposed on the boundary region of the substrate and between the cell active patterns and the peripheral active patterns. The cell device isolation pattern may include a first cell device isolation pattern having a first width and a second cell device isolation pattern having a second width smaller than the second width. A bottom surface of the insulating isolation pattern may include a first portion adjacent to the cell active patterns and a second portion adjacent to the peripheral active patterns. The second portion may be located at a height lower than the first portion, when measured from a bottom surface of the substrate. A bottom surface of the first cell device isolation pattern may be located at a height lower than a bottom surface of the second cell device isolation pattern and may be located at a height higher than the second portion of the bottom surface of the insulating isolation pattern, when measured from the bottom surface of the substrate.

According to embodiments, a method of fabricating a semiconductor device may include providing a substrate including a cell region, a peripheral region, and a boundary region therebetween, forming cell mask patterns and peripheral mask patterns on the cell region and the peripheral region, respectively, of the substrate, forming a mask pattern on the peripheral region of the substrate to cover the peripheral mask patterns and to expose the cell mask patterns, forming preliminary trenches in the cell region of the substrate, using the cell mask patterns and the mask pattern as an etch mask, removing the mask pattern, and forming cell trenches and peripheral trenches in the cell region and the peripheral region, respectively, of the substrate, using the cell mask patterns and the peripheral mask patterns as an etch mask. The cell trenches may be formed by etching portions of the substrate exposed through the preliminary trenches.

According to embodiments, a method of fabricating a semiconductor device may include providing a substrate including a cell region, a peripheral region, and a boundary region therebetween, forming cell trenches in the cell region of the substrate, forming an insulating layer on the substrate to fill the cell trenches, forming mask patterns on the insulating layer to fully cover the cell region and to expose a portion of the peripheral region, and etching the insulating layer and the substrate using the mask patterns as an etch mask to form peripheral trenches in the peripheral region of the substrate.

BRIEF DESCRIPTION OF THE DRAWINGS

Features will become apparent to those of skill in the art by describing in detail exemplary embodiments with reference to the attached drawings, in which.

DETAILED DESCRIPTION

Example embodiments will now be described more fully with reference to the accompanying drawings, in which example embodiments are shown.

Figure 1:
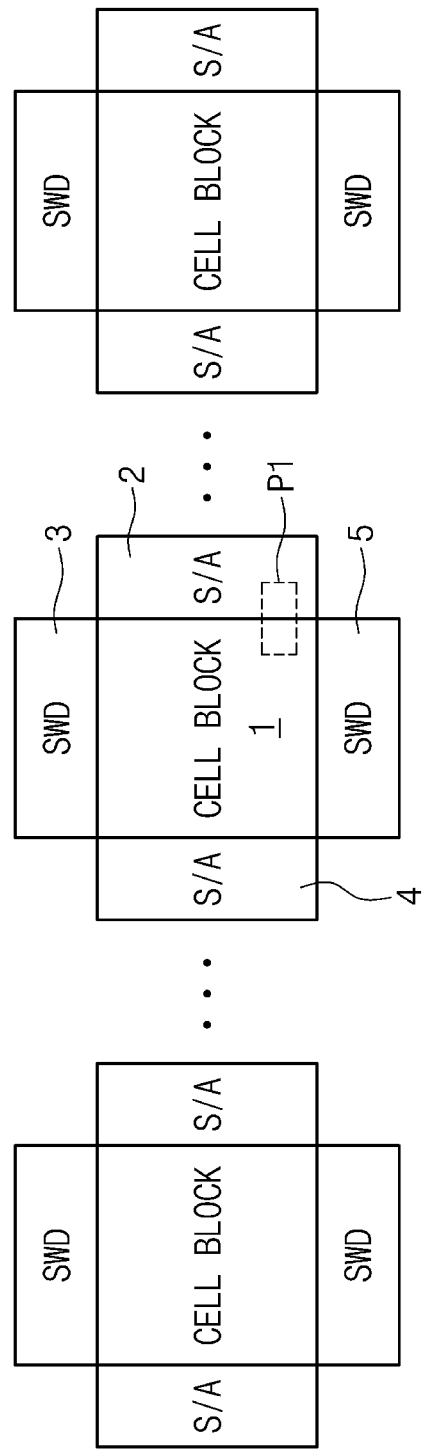
FIG. 1 is a block diagram illustrating a semiconductor device according to an embodiment.

FIG. 1 is a block diagram illustrating a semiconductor device according to an embodiment.

Referring to FIG. 1, a semiconductor device may include cell blocks 1 and peripheral blocks 2, 3, 4, and 5, which are disposed around each of the cell blocks 1. The semiconductor device may be a memory device, and each of the cell blocks 1 may include a cell circuit, e.g., an integrated memory circuit. The peripheral blocks 2, 3, 4, and 5 may include various peripheral circuits to operate the cell circuit, and the peripheral circuits may be electrically connected to the cell circuit.

In detail, the peripheral blocks 2, 3, 4, and 5 may include a first peripheral block 2, a second peripheral block 3, a third peripheral block 4, and a fourth peripheral block 5, which are disposed to surround each of the cell blocks 1. The first to fourth peripheral blocks 2, 3, 4, and 5 may include sense amplifier (S/A) circuits, sub-word line driver (SWD) circuits, and power and ground driver circuits, which are used to drive the sense amplifier. As an example, the first and third peripheral blocks 2 and 4, which are opposite to each other, may include the sense amplifier (S/A) circuits, and the second and fourth peripheral blocks 3 and 5, which are opposite to each other, may include the sub-word line driver (SWD) circuits. The second and fourth peripheral blocks 3 and 5 may further include the power and ground driver circuits, which are used to drive the sense amplifier, but embodiments are not limited to this example.

Figure 2:
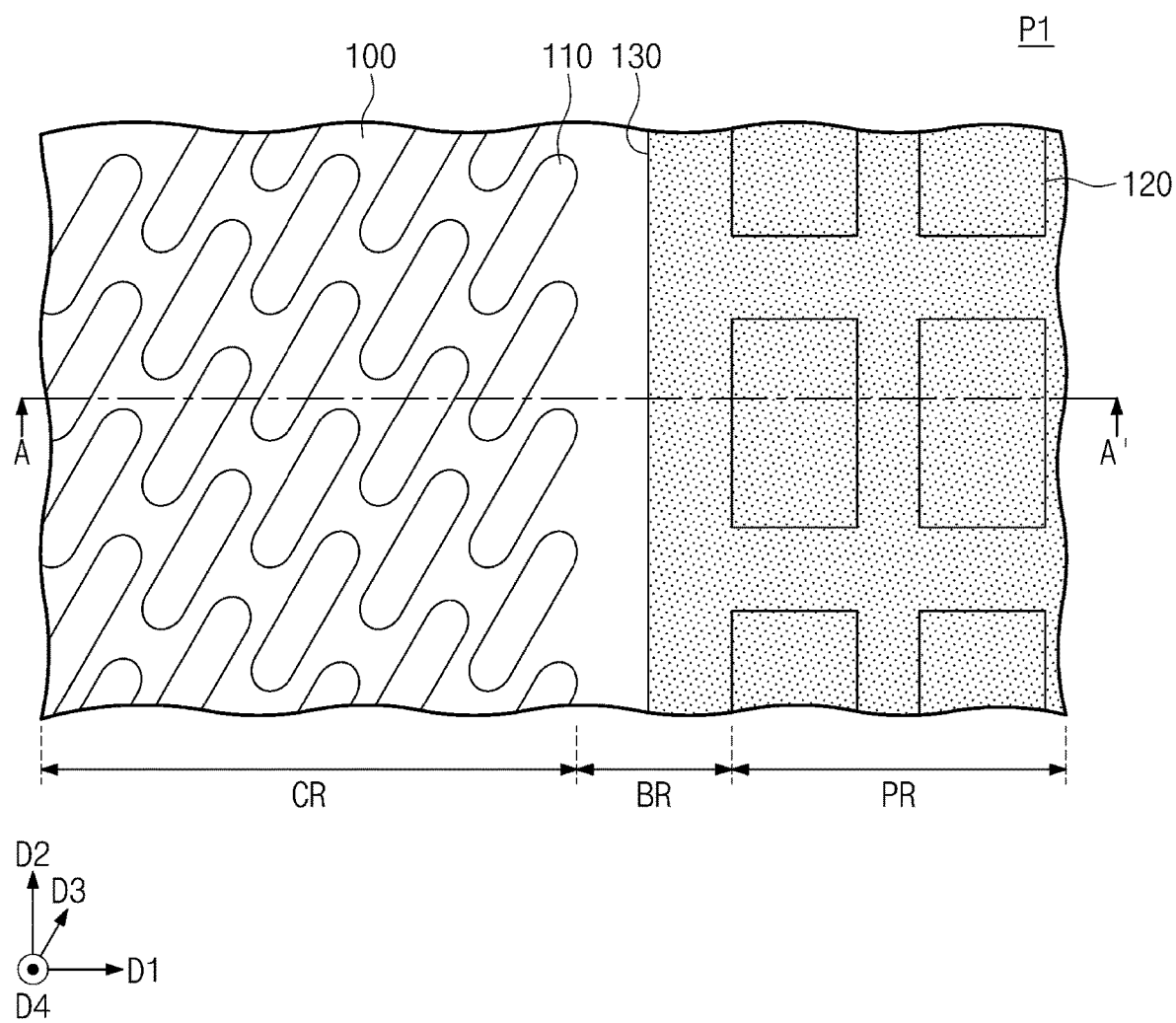
FIGS. 2 to 8 are diagrams illustrating stages in a method of fabricating a semiconductor device according to an embodiment.
Figure 3:
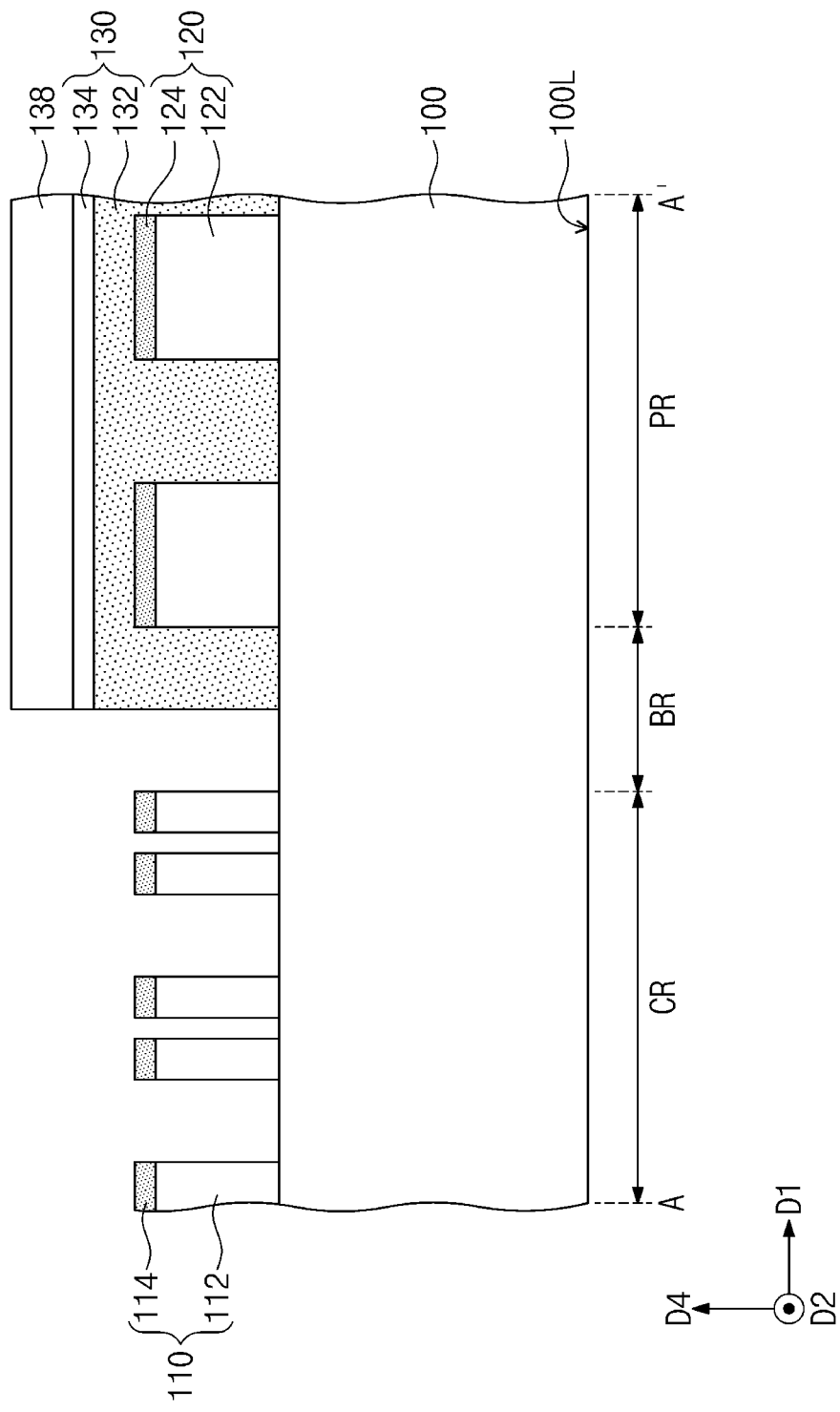
Figure 4:
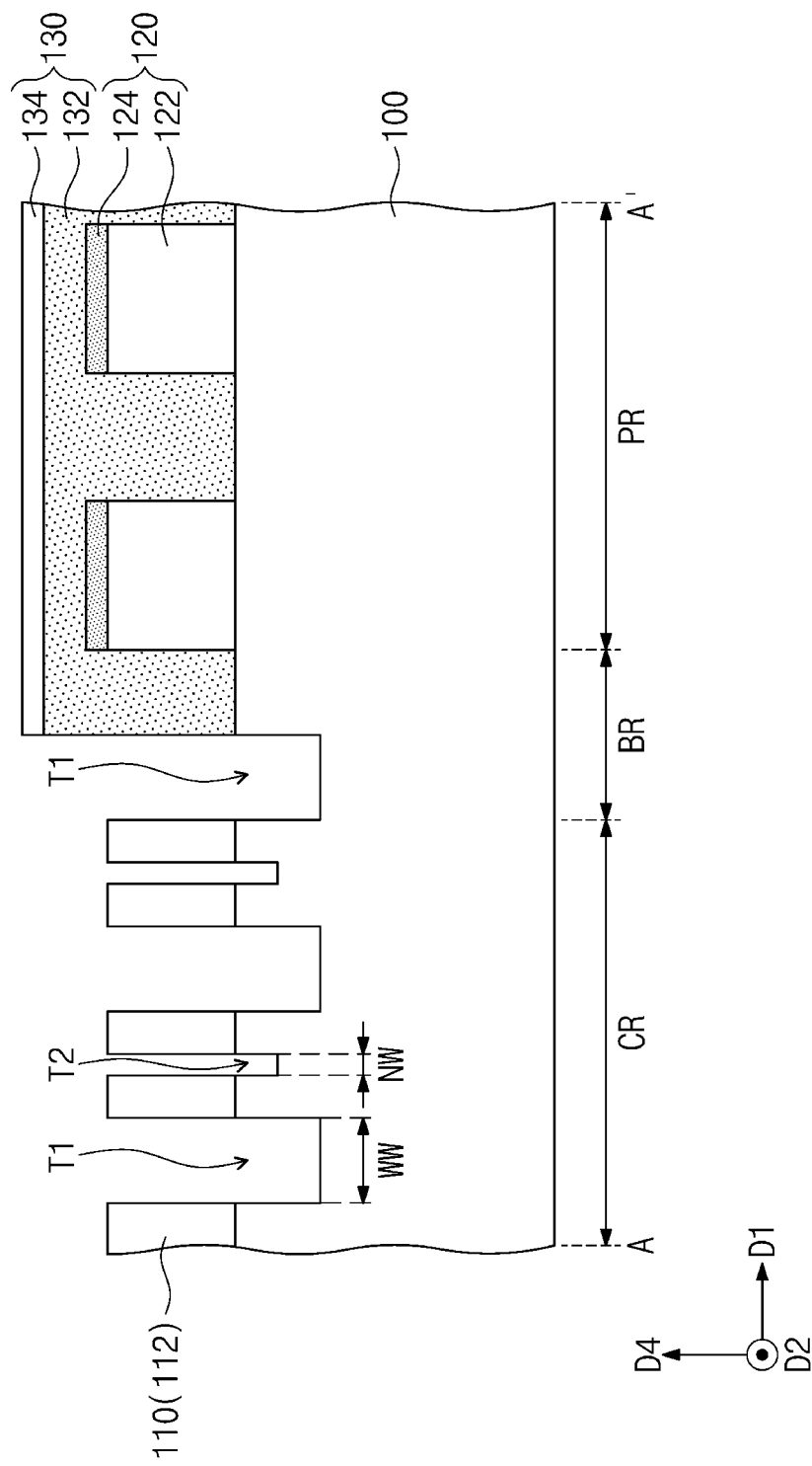
Figure 5:
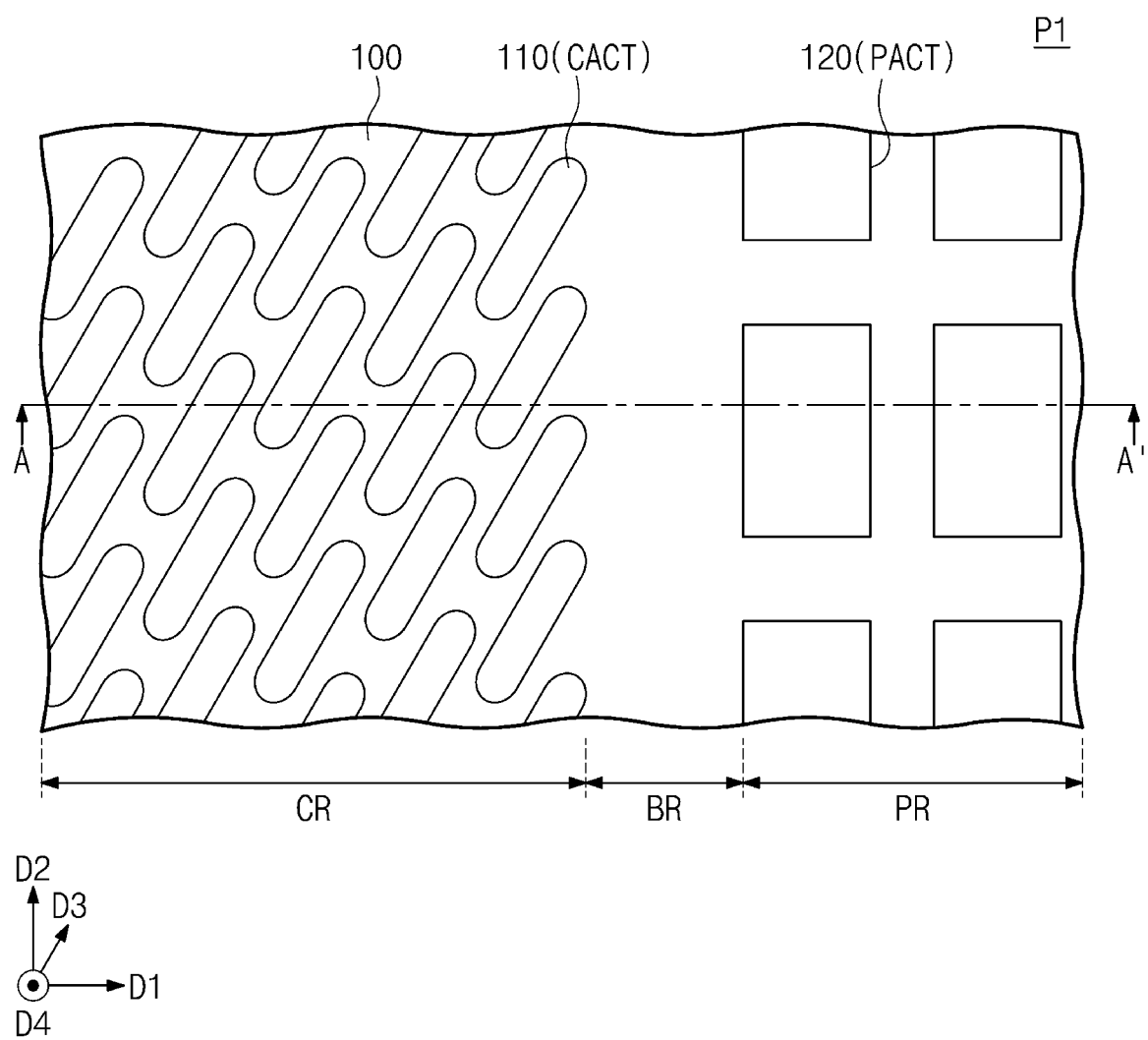

FIGS. 2 to 8 are diagrams illustrating stages in a method of fabricating a semiconductor device according to an embodiment. In detail, FIGS. 2 and 5 are plan views corresponding to portion P1 of FIG. 1, FIGS. 3 and 4 are sectional views corresponding to line A-A' of FIG. 2, and FIGS. 6 to 8 are sectional views corresponding to line A-A' of FIG. 5.

Referring to FIGS. 2 and 3, a substrate 100 may be provided. The substrate 100 may be a semiconductor substrate (e.g., a silicon wafer, a germanium wafer, or a silicon-germanium wafer). The substrate 100 may include a cell region CR, a peripheral region PR, and a boundary region BR therebetween. The cell region CR may be a region of the substrate 100, in which each cell block 1 of FIG. 1 is provided, and the peripheral region PR may be another region of the substrate 100, in which each peripheral block 2, 3, 4, or 5 of FIG. 1 is provided. The boundary region BR may be still another region of the substrate 100, which is interposed between the cell region CR and the peripheral region PR.

Cell mask patterns 110 and peripheral mask patterns 120 may be formed on the substrate 100. The cell mask patterns 110 may be formed on the cell region CR of the substrate 100. The cell mask patterns 110 may be spaced apart from each other in a first direction D1 and a second direction D2. The first and second directions D1 and D2 may be parallel to a bottom surface 100L of the substrate 100, and may not be parallel to each other. Each of the cell mask patterns 110 may be a bar-shaped pattern elongated in a third direction D3, when viewed in a plan view. The third direction D3 may be parallel to the bottom surface 100L of the substrate 100, and may not be parallel to both of the first and second directions D1 and D2, e.g., the third direction D3 may be at an oblique angle with respect to each of the first and second directions D1 and D2. The cell mask patterns 110 may be spaced apart from each other in the third direction D3. Each of the cell mask patterns 110 may include a first cell mask pattern 112 and a second cell mask pattern 114, which are sequentially stacked on the substrate 100, e.g., along a fourth direction D4 perpendicular to the bottom surface 100L of the substrate 100.

The peripheral mask patterns 120 may be formed on the peripheral region PR of the substrate 100. The peripheral mask patterns 120 may be spaced apart from each other in the first and second directions D1 and D2. Each of the peripheral mask patterns 120 may have a plate shape, e.g., elongated in the second direction D2, when viewed in a plan view, but embodiments are not limited to this example. Each of the peripheral mask patterns 120 may include a first peripheral mask pattern 122 and a second peripheral mask pattern 124, which are sequentially stacked on the substrate 100, e.g., along the fourth direction D4.

The first cell mask pattern 112 and the first peripheral mask pattern 122 may be formed of or include the same material. As an example, the first cell mask pattern 112 and the first peripheral mask pattern 122 may be formed of or include an oxide material (e.g., silicon oxide). The second cell mask pattern 114 and the second peripheral mask pattern 124 may be formed of or include the same material. As an example, the second cell mask pattern 114 and the second peripheral mask pattern 124 may be formed of or include poly silicon.

The cell mask patterns 110 and the peripheral mask patterns 120 may define regions, in which cell active patterns and peripheral active patterns to be described below will be formed, in the substrate 100.

A mask pattern 130 may be formed on the peripheral region PR of the substrate 100. The mask pattern 130 may cover the peripheral mask patterns 120 and may extend to a region on the boundary region BR of the substrate 100. The mask pattern 130 may cover a portion of the boundary region BR of the substrate 100. The mask pattern 130 may expose the cell region CR of the substrate 100. The mask pattern 130 may be formed to expose the cell mask patterns 110 and another portion of the boundary region BR of the substrate 100. The mask pattern 130 may include a first mask pattern 132 and a second mask pattern 134, which are sequentially stacked on the substrate 100. The first mask pattern 132 may be formed of or include at least one organic compound having a carbon content that is equal to or higher than 80%. As an example, the first mask pattern 132 may be a spin-on-hardmask (SOH) layer. The second mask pattern 134 may be formed of or include, e.g., silicon oxynitride.

As an example, the formation of the mask pattern 130 may include forming a mask layer on the substrate 100 provided with the cell mask patterns 110 and the peripheral mask patterns 120, forming a photoresist pattern 138 on the mask layer and etching the mask layer using the photoresist pattern 138 as an etch mask. The formation of the mask layer may include sequentially depositing a first mask layer and a second mask layer on the substrate 100. The photoresist pattern 138 may be formed to cover the peripheral region PR of the substrate 100 and to expose the cell region CR of the substrate 100. The photoresist pattern 138 may cover a portion of the boundary region BR adjacent to the peripheral region PR and may expose another portion of the boundary region BR adjacent to the cell region CR. The first mask layer and the second mask layer may be sequentially etched using the photoresist pattern 138 as an etch mask. As a result, the first mask layer and the second mask layer are removed from the cell region CR and a portion of the boundary region BR, and the first mask pattern 132 and the second mask pattern 134 may be formed on the peripheral region PR and a portion of the boundary region BR, e.g., only in a region overlapped by the photoresist pattern 138.

Referring to FIGS. 2 and 4, the photoresist pattern 138 may be removed after the formation of the mask pattern 130. A first etching process using the cell mask patterns 110 and the mask pattern 130 as an etch mask may be performed on the substrate 100. The first etching process may be performed to etch an upper portion of the substrate 100 and thereby to form preliminary trenches T1 and T2 in the cell and boundary regions CR and BR of the substrate 100.

The preliminary trenches T1 and T2 may include first preliminary trenches T1 having a relatively large width WW and second preliminary trenches T2 having a relatively small width NW. Each of the widths WW and NW may be a width measured in the first direction D1. The first preliminary trenches T1 may be formed in the cell and boundary regions CR and BR of the substrate 100, and the second preliminary trenches T2 may be formed in the cell region CR of the substrate 100. Due to an etch loading effect during the first etching process, the first preliminary trenches T1 of the relatively large width WW may be formed to be deeper in the substrate 100 than the second preliminary trenches T2 of the relatively small width NW. The second cell mask pattern 114 of each of the cell mask patterns 110 may be removed during the first etching process, and thus, the first cell mask pattern 112 may be hereinafter referred to as the cell mask pattern 110.

Figure 6:
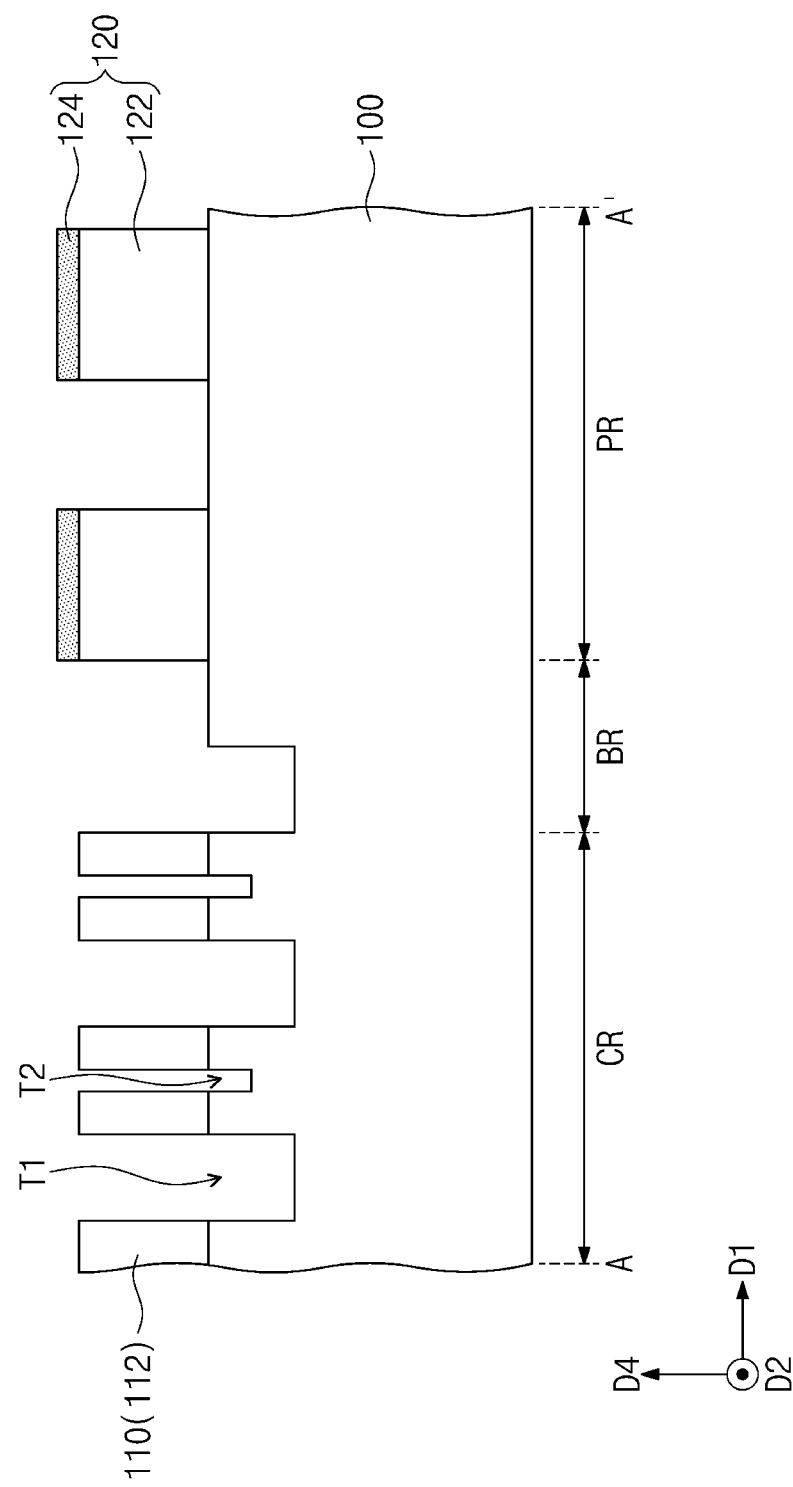

Referring to FIGS. 5 and 6, the mask pattern 130 may be removed, after the formation of the preliminary trenches T1 and T2. The mask pattern 130 may be removed by, e.g., an ashing and/or strip process. The peripheral region PR of the substrate 100, a portion of the boundary region BR of the substrate 100, and the peripheral mask patterns 120 may be exposed, as a result of the removal of the mask pattern 130.

Figure 7:
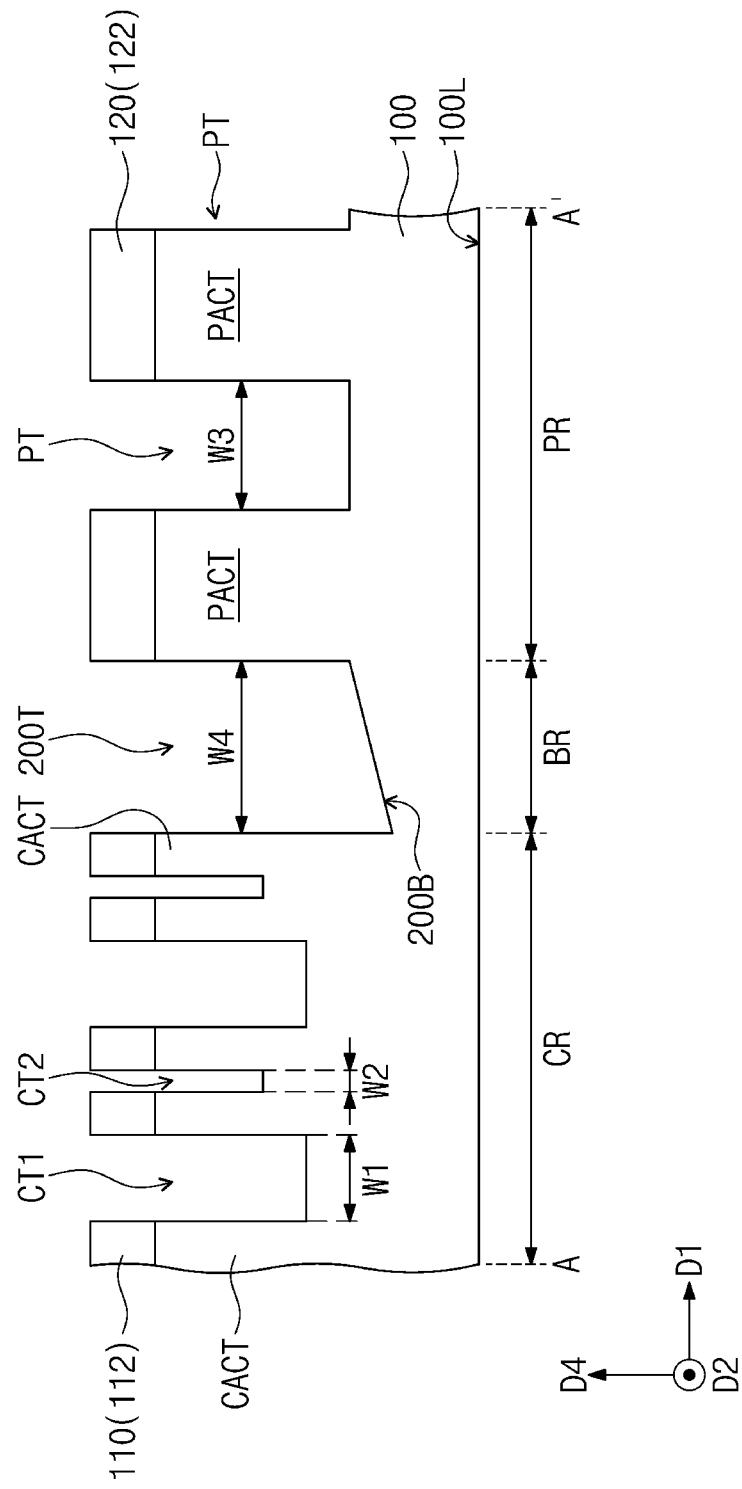

Referring to FIGS. 5 and 7, a second etching process using the cell mask patterns 110 and the peripheral mask patterns 120 as an etch mask may be performed on the substrate 100, after the removal of the mask pattern 130.

As a result of the second etching process, cell trenches CT1 and CT2 may be formed in the cell region CR of the substrate 100. The cell trenches CT1 and CT2 may be formed by etching portions of the substrate 100, which are exposed through the preliminary trenches T1 and T2, using the cell mask patterns 110 as an etch mask. The cell trenches CT1 and CT2 may be formed as a result of the extension of the preliminary trenches T1 and T2 into the substrate 100. The cell trenches CT1 and CT2 may include first cell trenches CT1 having a first width W1 and second cell trenches CT2 having a second width W2. Each of the first and second widths W1 and W2 may be a width measured in the first direction D1, and the first width W1 may be larger than the second width W2 (i.e., W1>W2). Due to an etch loading effect during the second etching process, the first cell trenches CT1 having the relatively large width W1 may be formed to be deeper in the substrate 100 than the second cell trenches CT2 having the relatively small width W2. The cell trenches CT1 and CT2 may define cell active patterns CACT and may expose side surfaces of the cell active patterns CACT. Each of the cell active patterns CACT may be a bar-shaped pattern elongated in the third direction D3. Each of the cell trenches CT1 and CT2 may be interposed between adjacent ones of the cell active patterns CACT.

As a result of the second etching process, peripheral trenches PT may be formed in the peripheral region PR of the substrate 100. The peripheral trenches PT may be formed by etching an upper portion of the substrate 100 using the peripheral mask patterns 120 as an etch mask. The peripheral trenches PT may have a third width W3 in the first direction D1. The third width W3 may be larger than each of the first and second widths W1 and W2 of the cell trenches CT1 and CT2. As an example, the third width W3 of the peripheral trenches PT may be larger than the first width W1 of the first cell trenches CT1, and the first width W1 of the first cell trenches CT1 may be larger than the second width W2 of the second cell trenches CT2 (i.e., W3>W1>W2). In this case, due to the etch loading effect during the second etching process, the peripheral trenches PT having the relatively large width W3 may be formed to be deeper in the substrate 100 than the cell trenches CT1 and CT2 having the relatively small widths W1 and W2. The peripheral trenches PT may define peripheral active patterns PACT and may expose side surfaces of the peripheral active patterns PACT. Each of the peripheral active patterns PACT may be a plate-shaped pattern, when viewed in a plan view, but embodiments are not limited to this example. Each of the peripheral trenches PT may be interposed between adjacent ones of the peripheral active patterns PACT.

An isolation trench 200T may be formed in the boundary region BR of the substrate 100 by the second etching process. The isolation trench 200T may be formed by deeply extending the first preliminary trench T1, which is formed in the boundary region BR of the substrate 100, into the substrate 100 and by etching an upper portion of the substrate 100 using the peripheral mask patterns 120 as an etch mask. The isolation trench 200T may have a fourth width W4 in the first direction D1, as measured between sidewalls of the isolation trench 200T. The fourth width W4 may be larger than the third width W3 of the peripheral trenches PT (i.e., W4>W3). The fourth width W4 of the isolation trench 200T may be larger than the first and second widths W1 and W2 of the cell trenches CT1 and CT2. In this case, due to the etch loading effect during the second etching process, the isolation trench 200T having the relatively large width W4 may be formed to be deeper in the substrate 100 than the cell trenches CT1 and CT2 having the relatively small widths W1 and W2. Furthermore, since the first preliminary trench T1, which is formed in the boundary region BR of the substrate 100, is deeply extended into the substrate 100 by the second etching process, a first portion of the isolation trench 200T (i.e., a portion adjacent to the cell region CR) may be formed to be deeper in the substrate 100 than a second portion of the isolation trench 200T (i.e., a portion adjacent to the peripheral region PR). As an example, the smaller the distance to the cell region CR of the substrate 100 along the first direction D1, the larger the depth of the isolation trench 200T extended into the substrate 100 along the fourth direction D4.

The isolation trench 200T may be formed between the cell active patterns CACT and the peripheral active patterns PACT. The isolation trench 200T may be interposed between a corresponding one of the cell active patterns CACT and a corresponding one of the peripheral active patterns PACT and may expose a side surface of the corresponding cell active pattern CACT and a side surface of the corresponding peripheral active pattern PACT. Since the smaller the distance to the cell region CR of the substrate 100, the larger the depth of the isolation trench 200T extended into the substrate 100, a height of a bottom surface 200B of the isolation trench 200T may be lowered with decreasing distance to the side surface of the corresponding cell active pattern CACT. In the present specification, the height may be a distance measured from the bottom surface 100L of the substrate 100. For example, the bottom surface 200B of the isolation trench 200T may be sloped relative to the bottom surface 100L of the substrate 100, so a distance between the bottom surface 200B of the isolation trench 200T and the bottom surface 100L of the substrate 100 may decrease as a distance from an outermost sidewall of an outermost one of the cell active patterns CACT decreases.

The second peripheral mask pattern 124 of each of the peripheral mask patterns 120 may be removed during the second etching process, and thus, the first peripheral mask pattern 122 may be hereinafter referred to as the peripheral mask pattern 120. Upper portions of the cell and peripheral mask patterns 110 and 120 may be lost during the second etching process, and portions of the cell and peripheral mask patterns 110 and 120 may be left on top surfaces of the cell and peripheral active patterns CACT and PACT, after the second etching process.

Figure 8:
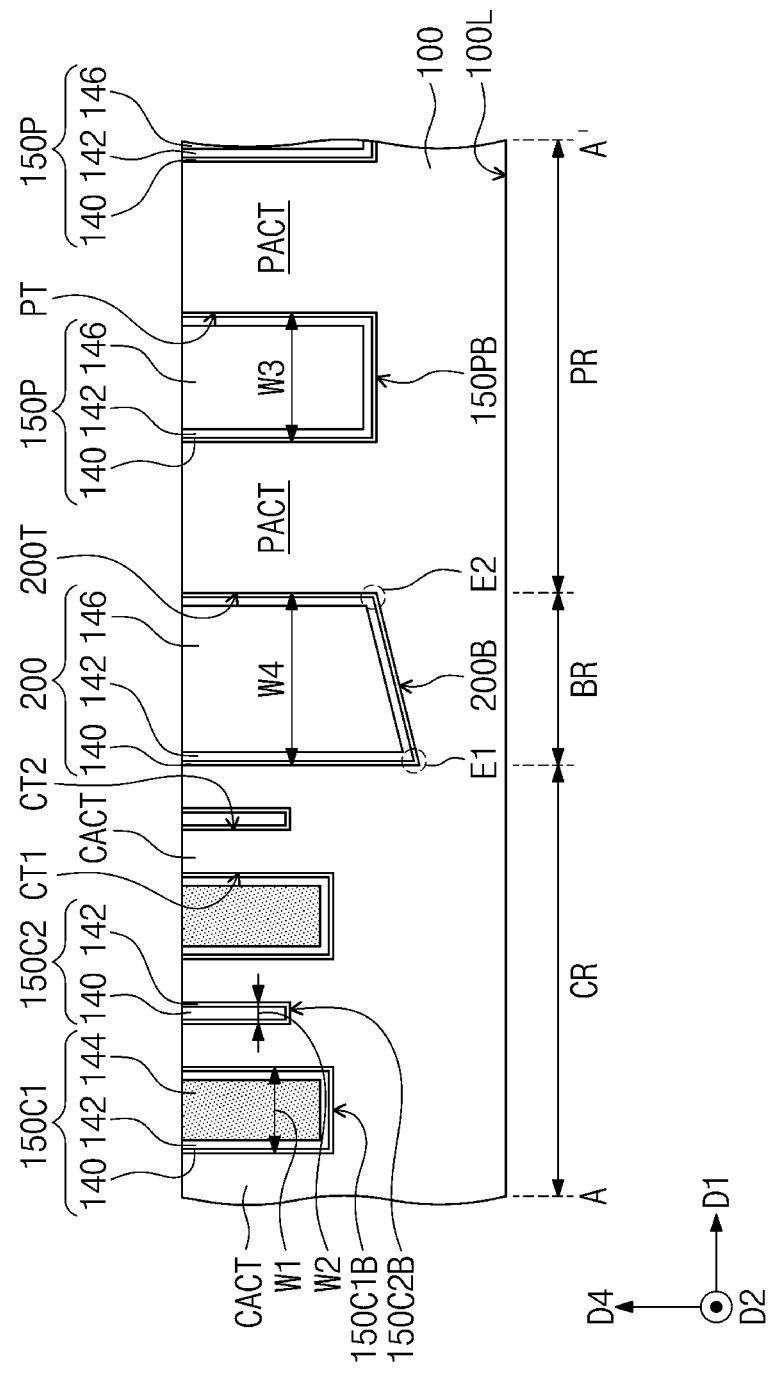

Referring to FIGS. 5 and 8, the remaining portions of the cell and peripheral mask patterns 110 and 120 may be removed, after forming the cell trenches CT1 and CT2, the peripheral trenches PT, and the isolation trench 200T in the substrate 100. The remaining portions of the cell and peripheral mask patterns 110 and 120 may be removed using, e.g., a wet etching process. The top surfaces of the cell and peripheral active patterns CACT and PACT may be exposed, as a result of the removal of the remaining portions of the cell and peripheral mask patterns 110 and 120.

Cell device isolation patterns 150C1 and 150C2 may be formed in the cell trenches CT1 and CT2, respectively. The cell device isolation patterns 150C1 and 150C2 may be interposed between the cell active patterns CACT to define the cell active patterns CACT. The cell device isolation patterns 150C1 and 150C2 may be in contact with side surfaces of the cell active patterns CACT. The cell device isolation patterns 150C1 and 150C2 may include first cell device isolation patterns 150C1 in the first cell trenches CT1 and second cell device isolation patterns 150C2 in the second cell trenches CT2. Each of the first cell device isolation patterns 150C1 may include a first oxide layer 140, a second oxide layer 142, and a nitride layer 144. Each of the second cell device isolation patterns 150C2 may include the first and second oxide layers 140 and 142 but may not include the nitride layer 144.

Peripheral device isolation patterns 150P may be formed in the peripheral trenches PT, respectively. The peripheral device isolation patterns 150P may be interposed between the peripheral active patterns PACT to define the peripheral active patterns PACT. The peripheral device isolation patterns 150P may be in contact with side surfaces of the peripheral active patterns PACT. The peripheral device isolation patterns 150P may include the first oxide layer 140, the second oxide layer 142, and a third oxide layer 146 but may not include the nitride layer 144.

An insulating isolation pattern 200 may be formed in the isolation trench 200T. The insulating isolation pattern 200 may be disposed between the cell active patterns CACT and the peripheral active patterns PACT. The insulating isolation pattern 200 may be interposed between a corresponding one of the cell active patterns CACT and a corresponding one of the peripheral active patterns PACT, and may be in contact with a side surface of the corresponding cell active pattern CACT and a side surface of the corresponding peripheral active pattern PACT. The insulating isolation pattern 200 may include the first oxide layer 140, the second oxide layer 142, and the third oxide layer 146 but may not include the nitride layer 144.

The formation of the cell device isolation patterns 150C1 and 150C2, the peripheral device isolation patterns 150P, and the insulating isolation pattern 200 may include sequentially forming the first and second oxide layers 140 and 142 on the substrate 100 provided with the cell trenches CT1 and CT2, the peripheral trenches PT, and the isolation trench 200T. The first oxide layer 140 may be formed to conformally cover an inner surface of each of the cell trenches CT1 and CT2, the peripheral trenches PT, and the isolation trench 200T. The second oxide layer 142 may be formed to fill a portion of each of the first cell trenches CT1, the peripheral trenches PT, and the isolation trench 200T and to fill a remaining portion of each of the second cell trenches CT2. In an embodiment, the formation of the cell device isolation patterns 150C1 and 150C2, the peripheral device isolation patterns 150P, and the insulating isolation pattern 200 may further include forming the nitride layer 144 on the substrate 100, which is provided with the first and second oxide layers 140 and 142, to fill a remaining portion of each of the first cell trenches CT1 and a portion of each of the peripheral trenches PT and the isolation trench 200T, followed by removal of the nitride layer 144 from the peripheral trenches PT and the isolation trench 200T. Accordingly, the nitride layer 144 may be locally formed in the first cell trenches CT1. In an embodiment, the formation of the cell device isolation patterns 150C1 and 150C2, the peripheral device isolation patterns 150P, and the insulating isolation pattern 200 may further include forming the third oxide layer 146 on the substrate 100, which is provided with the nitride layer 144, to fill a remaining portion of each of the peripheral device isolation patterns 150P and the insulating isolation pattern 200, followed by a planarization process to expose the top surfaces of the cell active patterns CACT and the peripheral active patterns PACT. As a result of the planarization process, the cell device isolation patterns 150C1 and 150C2, the peripheral device isolation patterns 150P, and the insulating isolation pattern 200 may be locally formed in the cell trenches CT1 and CT2, the peripheral trenches PT, and the isolation trench 200T, respectively.

The first cell device isolation patterns 150C1 may have the first width W1, and the second cell device isolation patterns 150C2 may have the second width W2. The first width W1 may be larger than the second width W2 (i.e., W1>W2). Since, as described with reference to FIGS. 5 and 7, the first cell trenches CT1 are formed to be deeper in the substrate 100 than the second cell trenches CT2, a bottom surface 150C1B of each of the first cell device isolation patterns 150C1 may be located at a height lower than a bottom surface 150C2B of each of the second cell device isolation patterns 150C2, when measured from the bottom surface 100L of the substrate 100. In the present specification, the height may be a distance measured from the bottom surface 100L of the substrate 100.

The peripheral device isolation patterns 150P may have the third width W3, which may be larger than each of the first width W1 of the first cell device isolation patterns 150C1 and the second width W2 of the second cell device isolation patterns 150C2. Since, as described with reference to FIGS. 5 and 7, the peripheral trenches PT are formed to be deeper in the substrate 100 than the cell trenches CT1 and CT2, a bottom surface 150PB of each of the peripheral device isolation patterns 150P may be located at a height lower than the bottom surface 150C1B of each of the first cell device isolation patterns 150C1 and the bottom surface 150C2B of each of the second cell device isolation patterns 150C2, when measured from the bottom surface 100L of the substrate 100.

The insulating isolation pattern 200 may have the fourth width W4, which may be larger than the third width W3 of the peripheral device isolation patterns 150P. Since, with decreasing distance to the cell region CR of the substrate 100, the isolation trench 200T may have an increasing depth, as described with reference to FIGS. 5 and 7, the bottom surface 200B of the insulating isolation pattern 200 may be inclined at an angle to the bottom surface 100L of the substrate 100. The bottom surface 200B of the insulating isolation pattern 200 may correspond to the bottom surface 200B of the isolation trench 200T. The bottom surface 200B of the insulating isolation pattern 200 may have a profile that is inclined at an angle to the bottom surface 100L of the substrate 100. The bottom surface 200B of the insulating isolation pattern 200 may include a first edge E1 adjacent to a side surface of a corresponding one of the cell active patterns CACT and a second edge E2 adjacent to a side surface of a corresponding one of the peripheral active patterns PACT. The first edge E1 may be located at a height lower than the second edge E2, when measured from the bottom surface 100L of the substrate 100.

The second edge E2 of the bottom surface 200B of the insulating isolation pattern 200 may be located at a height lower than the bottom surfaces 150C1B and 150C2B of the cell device isolation patterns 150C1 and 1502C2, when measured from the bottom surface 100L of the substrate 100. The bottom surface 150C1B of each of the first cell device isolation patterns 150C1 may be located at a height that is lower than a bottom surface 150C2B of each of the second cell device isolation patterns 150C2 and is higher than the second edge E2 of the bottom surface 200B of the insulating isolation pattern 200. In an embodiment, the second edge E2 of the bottom surface 200B of the insulating isolation pattern 200 may be located at a substantially same height as the bottom surface 150PB of each of the peripheral device isolation patterns 150P.

When measured from the bottom surface 100L of the substrate 100, the first edge E1 of the bottom surface 200B of the insulating isolation pattern 200 may be located at a height lower than the bottom surfaces 150C1B and 150C2B of the cell device isolation patterns 150C1 and 1502C2, and may be located at a height lower than the bottom surface 150PB of each of the peripheral device isolation patterns 150P. As an example, a height of the bottom surface 200B of the insulating isolation pattern 200 may be gradually lowered from the second edge E2 toward the first edge E1.

A distance between adjacent ones of the cell active patterns CACT (i.e., between the cell mask patterns 110) may be smaller than a distance between adjacent ones of the peripheral active patterns PACT (i.e., between the peripheral mask patterns 120). If the cell trenches CT1 and CT2 and the peripheral trenches PT were to be formed by a single etching process using the cell mask patterns 110 and the peripheral mask patterns 120 as an etch mask, the peripheral trenches PT would have been formed to be deeper in the substrate 100 than the cell trenches CT1 and CT2. However, since electric isolation between cell transistors on cell active patterns requires cell trenches of the cell active patterns to be formed to a specific depth, formation of the cell trenches CT1 and CT2 and the peripheral trenches PT by the single etching process would have caused the etching process to continue until the cell trenches CT1 and CT2 have the specific depth, thereby causing the peripheral trenches PT to be deeper than the specific depth. In the case where the depth of the peripheral trenches PT is larger than the specific depth, a crystal defect issue (e.g., silicon dislocation) may occur in the peripheral active patterns PACT.

In contrast, according to an embodiment, the preliminary trenches T1 and T2 may be formed in the cell and boundary regions CR and BR of the substrate 100 by the first etching process. The cell trenches CT1 and CT2 may be formed by further etching portions of the substrate 100, which are exposed through the preliminary trenches T1 and T2, through the second etching process, and the peripheral trenches PT and the isolation trench 200T may be formed by etching upper portions of the substrate 100 through the second etching process. By forming the preliminary trenches T1 and T2 by a separate etching process, it may be possible to suppress the cell trenches CT1 and CT2 and the peripheral trenches PT from being affected by the etch loading effect in the second etching process. Thus, the cell trenches CT1 and CT2 may be easily formed to have a depth required for the electric isolation between the cell transistors, and the peripheral trenches PT may be easily formed to have a depth capable of preventing the crystal defect issue (e.g., silicon dislocation) from occurring in the peripheral active patterns PACT. Accordingly, it may be possible to easily fabricate a semiconductor device with improved electric characteristics. In addition, due to the formation of the preliminary trenches T1 and T2, the bottom surface 200B of the isolation trench 200T in the boundary region BR may be inclined to have a smaller height with a decreasing distance from the cell active pattern CACT.

Figure 9:
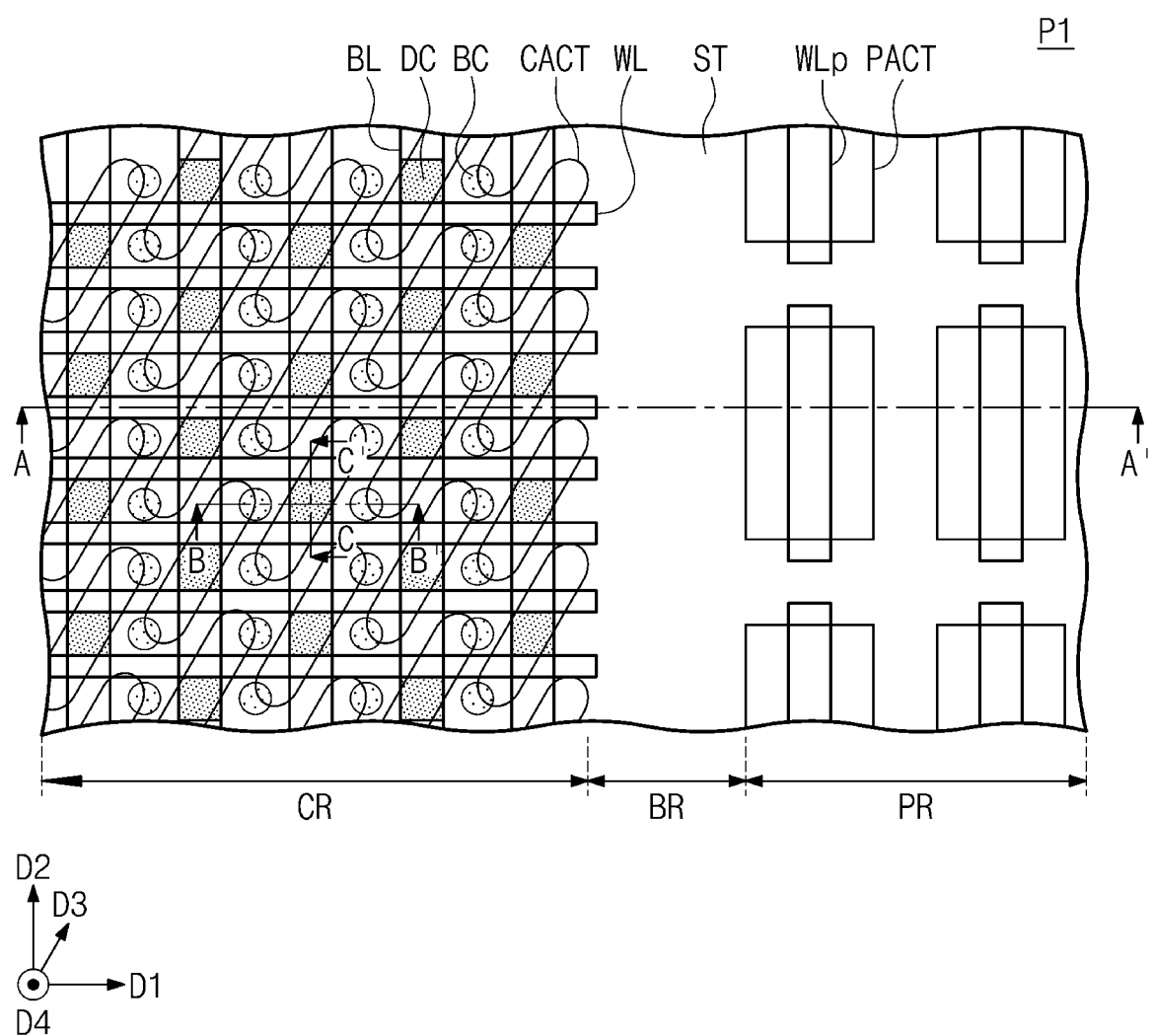
FIG. 9 is a plan view illustrating a semiconductor device according to an embodiment.
Figure 10:
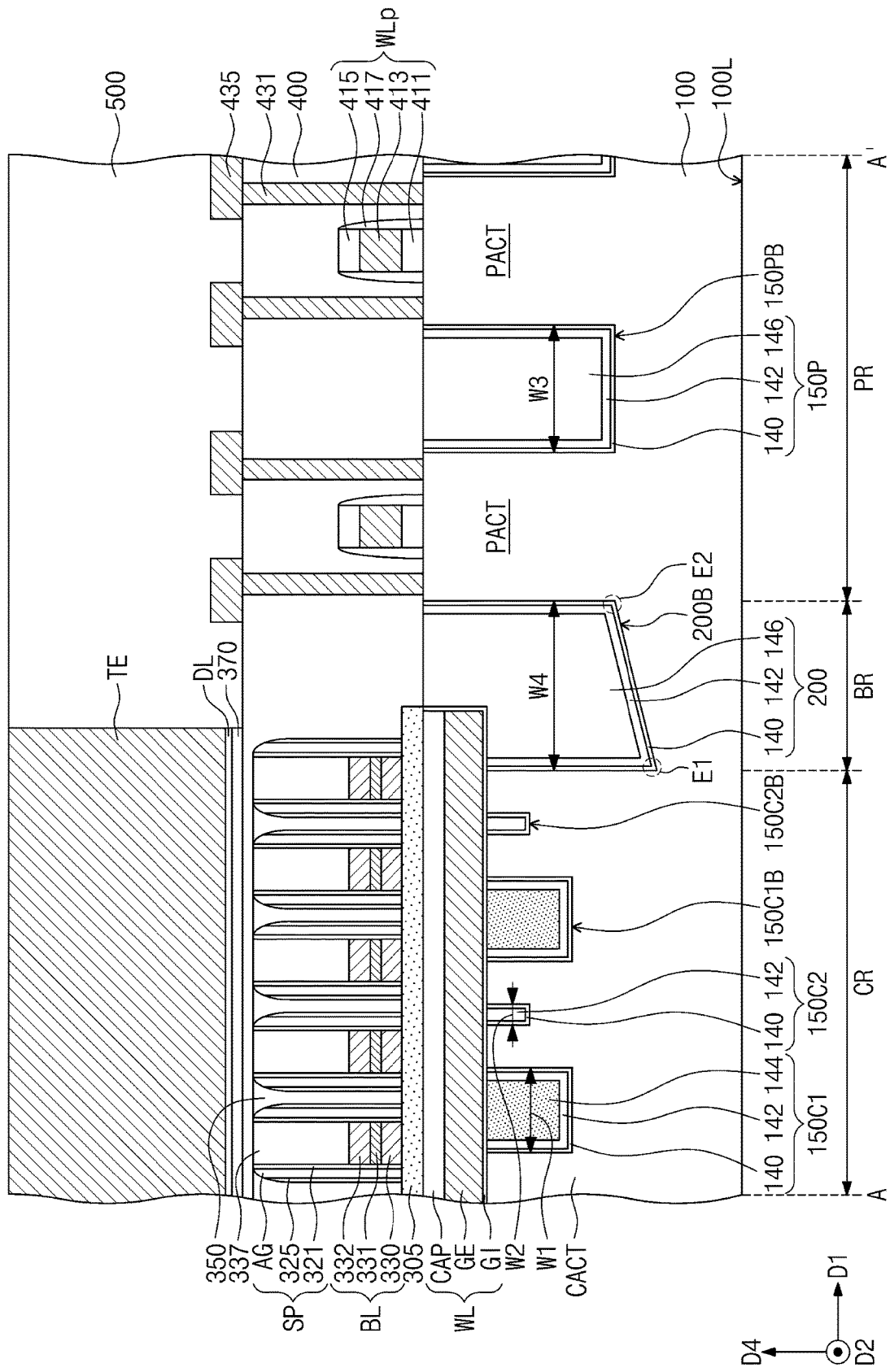
FIG. 10 is a sectional view taken along line A-A' of FIG. 9.

FIG. 9 is a plan view illustrating a semiconductor device according to an embodiment. FIG. 10 is a sectional view taken along line A-A' of FIG. 9, and FIG. 11 is a sectional view taken along lines B-B' and C-C' of FIG. 9.

Figure 11:
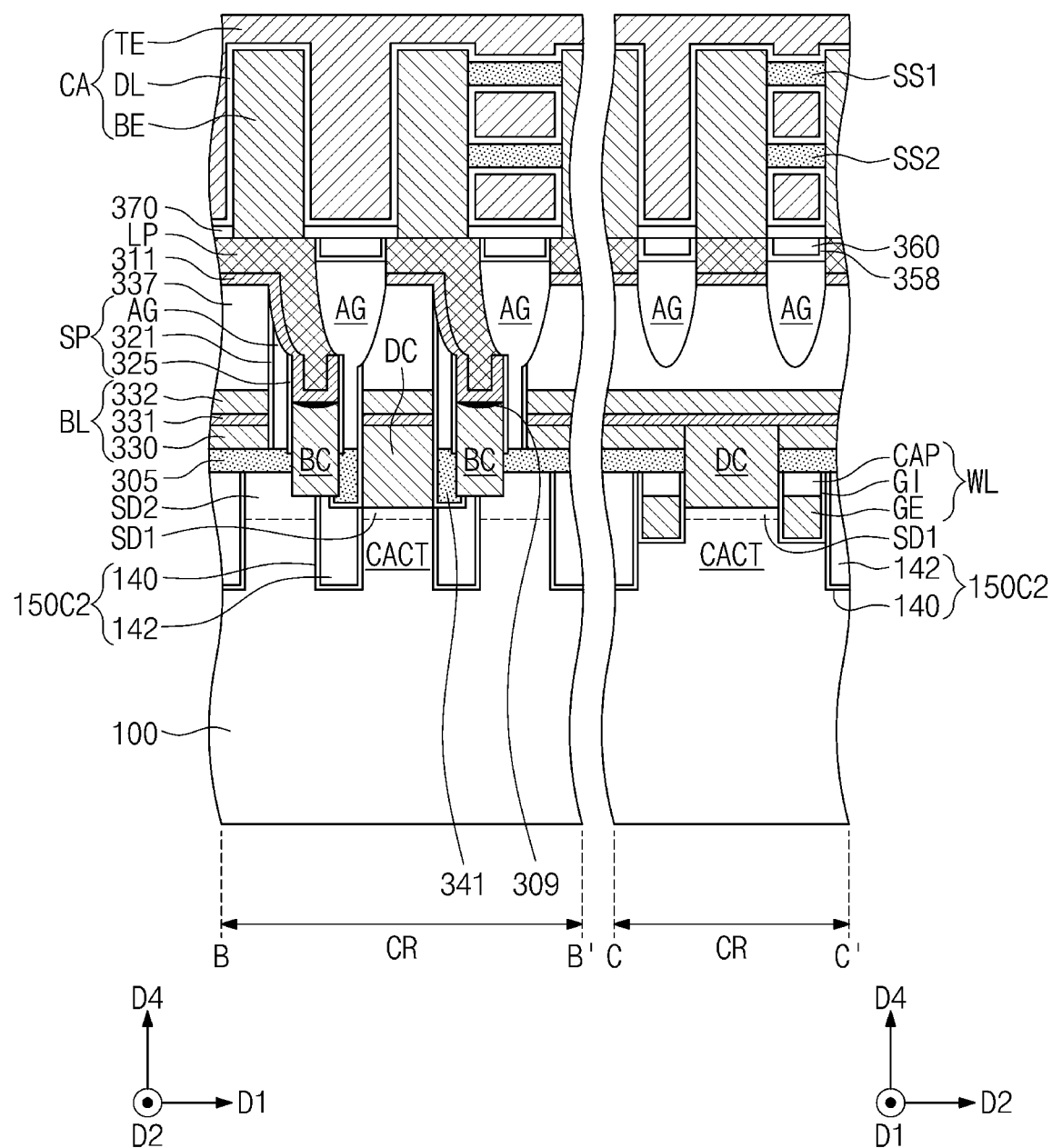
FIG. 11 is a sectional view taken along lines B-B' and C-C' of FIG. 9.

Referring to FIGS. 9 to 11, the cell device isolation patterns 150C1 and 150C2 may be disposed in the cell region CR of the substrate 100 to define the cell active patterns CACT. The cell active patterns CACT may protrude from the substrate 100, and each of the cell device isolation patterns 150C1 and 150C2 may be interposed between adjacent ones of the cell active patterns CACT. The cell device isolation patterns 150C1 and 150C2 may include the first cell device isolation patterns 150C1 having the first width W1 and the second cell device isolation patterns 150C2 having the second width W2. The first width W1 may be larger than the second width W2 (i.e., W1>W2). The bottom surface 150C1B of each of the first cell device isolation patterns 150C1 may be positioned at a height lower than a bottom surface 150C2B of each of the second cell device isolation patterns 150C2, when measured from the bottom surface 100L of the substrate 100.

The peripheral device isolation patterns 150P may be disposed in the peripheral region PR of the substrate 100 to define peripheral active patterns PACT. The peripheral active patterns PACT may protrude from the substrate 100, and each of the peripheral device isolation patterns 150P may be interposed between adjacent ones of the peripheral active patterns PACT. The peripheral device isolation patterns 150P may have the third width W3, which is larger than the first width W1 of the first cell device isolation patterns 150C1 and the second width W2 of the second cell device isolation patterns 150C2. The bottom surface 150PB of each of the peripheral device isolation patterns 150P may be located at a height lower than the bottom surface 150C1B of each of the first cell device isolation patterns 150C1 and the bottom surface 150C2B of each of the second cell device isolation patterns 150C2, when measured from the bottom surface 100L of the substrate 100.

The insulating isolation pattern 200 may be disposed in the boundary region BR of the substrate 100. The insulating isolation pattern 200 may be disposed between the cell active patterns CACT and the peripheral active patterns PACT. The insulating isolation pattern 200 may be interposed between a corresponding one of the cell active patterns CACT and a corresponding one of the peripheral active patterns PACT. The insulating isolation pattern 200 may have the fourth width W4, and here the fourth width W4 may be larger than the third width W3 of the peripheral device isolation patterns 150P. The bottom surface 200B of the insulating isolation pattern 200 may include the first edge E1 adjacent to a side surface of the corresponding cell active pattern CACT and the second edge E2 adjacent to a side surface of the corresponding peripheral active pattern PACT. The first edge E1 may be located at a height lower than the second edge E2, when measured from the bottom surface 100L of the substrate 100. As an example, a height of the bottom surface 200B of the insulating isolation pattern 200 may be gradually lowered from the second edge E2 toward the first edge E1. Thus, the bottom surface 200B of the insulating isolation pattern 200 may have a profile that is inclined at an angle with respect to the bottom surface 100L of the substrate 100. The first edge E1 may be located at a height lower than the bottom surface 150PB of each of the peripheral device isolation patterns 150P. In an embodiment, the second edge E2 may be located at substantially the same height as the bottom surface 150PB of each of the peripheral device isolation patterns 150P.

The cell device isolation patterns 150C1 and 150C2, the peripheral device isolation patterns 150P, and the insulating isolation pattern 200 may be formed by the method, described with reference to FIGS. 1 to 8, according to an embodiment. The cell device isolation patterns 150C1 and 150C2, the peripheral device isolation patterns 150P, and the insulating isolation pattern 200 may be connected to each other to form a single device isolation layer ST.

Word lines WL may be provided on the cell region CR of the substrate 100 to cross the cell active patterns CACT and the cell device isolation patterns 150C1 and 150C2. The word lines WL may be extended in the first direction D1 and may be arranged in the second direction D2. Each of the word lines WL may include a cell gate electrode GE, which is buried in the substrate 100, a cell gate dielectric pattern GI, which is interposed between the cell gate electrode GE and the cell active patterns CACT and between the cell gate electrode GE and the cell device isolation patterns 150C1 and 150C2, and a cell gate capping pattern CAP, which is provided on a top surface of the cell gate electrode GE. The cell gate electrode GE may be formed of or include at least one conductive material. For example, the conductive material may include doped semiconductor materials (e.g., doped silicon, doped germanium, and so forth), conductive metal nitrides (e.g., titanium nitride, tantalum nitride, and so forth), metallic materials (e.g., tungsten, titanium, tantalum, and so forth), and metal-semiconductor compounds (e.g., tungsten silicide, cobalt silicide, titanium silicide, and so forth). The cell gate dielectric pattern GI may be formed of or include at least one of, e.g., silicon oxide, silicon nitride, and/or silicon oxynitride. The cell gate capping pattern CAP may be formed of or include at least one of, e.g., silicon oxide, silicon nitride, and/or silicon oxynitride.

A first impurity injection region SD1 and second impurity injection regions SD2 may be provided in each of the cell active patterns CACT. The second impurity injection regions SD2 may be spaced apart from each other with the first impurity injection region SD1 interposed therebetween. The first impurity injection region SD1 may be provided a pair of word lines WL, which are provided to cross the cell active patterns CACT. The second impurity injection regions SD2 may be spaced apart from each other with the pair of word lines WL interposed therebetween. The first impurity injection region SD1 may contain the same impurities as those in the second impurity injection regions SD2 or may have the same conductivity type as that of the second impurity injection regions SD2.

An insulating layer 305 may be disposed on the cell region CR of the substrate 100 to cover the word lines WL and the cell active patterns CACT. Bit lines BL may be disposed on the insulating layer 305, on the cell region CR of the substrate 100. The bit lines BL may be disposed to cross the word lines WL. The bit lines BL may be extended in the second direction D2 and may be arranged to be spaced apart from each other in the first direction D1. Each of the bit lines BL may include a polysilicon pattern 330, an ohmic pattern 331, and a metal-containing pattern 332, which are sequentially stacked. Bit line capping patterns 337 may be disposed on the bit lines BL, respectively. The bit line capping patterns 337 may be formed of or include an insulating material (e.g., silicon nitride).

Bit line contacts DC may be disposed below each of the bit lines BL and may be spaced apart from each other in the second direction D2. Each of the bit line contacts DC may be electrically connected to the first impurity injection region SD1. The bit line contacts DC may be formed of or include at least one of doped semiconductor materials (e.g., doped silicon, doped germanium, and so forth), conductive metal nitrides (e.g., titanium nitride, tantalum nitride, and so forth), metallic materials (e.g., tungsten, titanium, tantalum, and so forth), and metal-semiconductor compounds (e.g., tungsten silicide, cobalt silicide, titanium silicide, and so forth). A lower insulating gapfill layer 341 may be disposed on a side surface of each of the bit line contacts DC.

Storage node contacts BC may be disposed between an adjacent pair of bit lines BL. The storage node contacts BC may be spaced apart from each other in the second direction D2. The storage node contacts BC may be formed of or include, e.g., doped or intrinsic polysilicon. Supporting patterns 350 may be disposed between the pair of bit lines BL and between the storage node contacts BC. The supporting patterns 350 and the storage node contacts BC may be alternately disposed in the first direction D1, between the pair of bit lines BL. The supporting patterns 350 may be formed of or include, e.g., silicon nitride.

A bit line spacer SP may be interposed between each of the bit lines BL and the storage node contacts BC. The bit line spacer SP may include a first sub-spacer 321 and a second sub-spacer 325, which are spaced apart from each other by an air gap AG. The first sub-spacer 321 may cover a side surface of each of the bit lines BL and a side surface of each of the bit line capping patterns 337. The second sub-spacer 325 may be adjacent to the storage node contacts BC. The first sub-spacer 321 and the second sub-spacer 325 may be formed of or include the same material (e.g., silicon nitride).

A storage node ohmic layer 309 may be disposed on each of the storage node contacts BC. The storage node ohmic layer 309 may be formed of or include at least one metal silicide material. The storage node ohmic layer 309, the first and second sub-spacers 321 and 325, and the bit line capping patterns 337 may be conformally covered with a diffusion prevention pattern 311. The diffusion prevention pattern 311 may be formed of or include at least one of metal nitrides (e.g., titanium nitride and tantalum nitride). A landing pad LP may be disposed on the diffusion prevention pattern 311. The landing pad LP may be formed of or include a metal-containing material (e.g., tungsten). An upper portion of the landing pad LP may have a width that is larger than the storage node contact BC. A center of the landing pad LP may be shifted from a center of the storage node contact BC, e.g., along the first direction D1.

A first capping pattern 358 and a second capping pattern 360 may be provided between adjacent ones of the landing pads LP. Each of the first and second capping patterns 358 and 360 may be formed of or include at least one of, e.g., silicon nitride, silicon oxide, silicon oxynitride, or porous materials. The air gap AG between the first and second sub-spacers 321 and 325 may be extended into a region between the landing pads LP. The first capping pattern 358, the bit line capping pattern 337, and the landing pad LP may be partially exposed by the air gap AG.

Lower electrodes BE may be disposed on the landing pads LP, respectively. The lower electrodes BE may be formed of or include at least one of doped poly-silicon, metal nitrides (e.g., titanium nitride), or metals (e.g., tungsten, aluminum, and copper). Each of the lower electrodes BE may have a circular pillar shape, a hollow cylinder shape, or a cup shape. Upper side surfaces of the lower electrodes BE may be supported by an upper supporting pattern SS1, and lower side surfaces of the lower electrodes BE may be supported by a lower supporting pattern SS2. The upper and lower supporting patterns SS1 and SS2 may be formed of or include at least one insulating material (e.g., silicon nitride, silicon oxide, and silicon oxynitride).

An etch stop layer 370 may be provided between the lower electrodes BE to cover the first and second capping patterns 358 and 360. The etch stop layer 370 may be formed of or include at least one insulating materials (e.g., silicon nitride, silicon oxide, and silicon oxynitride). A dielectric layer DL may be provided to cover surfaces of the lower electrodes BE and the upper and lower supporting patterns SS1 and SS2. An upper electrode TE may be disposed on the dielectric layer DL and may fill a space between the lower electrodes BE. The upper electrode TE may be formed of or include at least one of doped poly-silicon, doped silicon-germanium, metal nitrides (e.g., titanium nitride), or metals (e.g., tungsten, aluminum, and copper). The lower electrodes BE, the dielectric layer DL, and the upper electrode TE may constitute a capacitor CA.

Peripheral word lines WLp may be disposed on the peripheral circuit region PR of the substrate 100 to cross the peripheral active patterns PACT. Each of the peripheral word lines WLp may include a peripheral gate electrode 413 crossing the peripheral active patterns PACT, a peripheral gate dielectric pattern 411 between the substrate 100 and the peripheral gate electrode 413, a peripheral gate capping pattern 415 on a top surface of the peripheral gate electrode 413, and peripheral gate spacers 417 on side surfaces of the peripheral gate electrode 413.

A first interlayer insulating layer 400 may be disposed on the peripheral circuit region PR of the substrate 100 to cover the peripheral word lines WLp. The first interlayer insulating layer 400 may be extended to a region on the boundary region BR of the substrate 100 to cover a top surface of the insulating isolation pattern 200. Peripheral contacts 431 may be disposed at both sides of each of the peripheral word lines WLp. Each of the peripheral contacts 431 may be provided to penetrate the first interlayer insulating layer 400 and may be connected to a corresponding one of the peripheral active patterns PACT. Peripheral lines 435 may be disposed on the first interlayer insulating layer 400 and may be connected to the peripheral contacts 431. The peripheral contacts 431 and the peripheral lines 435 may be formed of or include at least one conductive material. A second interlayer insulating layer 500 may be disposed on the peripheral circuit region PR of the substrate 100 and on the first interlayer insulating layer 400. The second interlayer insulating layer 500 may cover the peripheral lines 435. Each of the first and second interlayer insulating layers 400 and 500 may include at least one of a silicon oxide layer, a silicon nitride layer, and/or a silicon oxynitride layer.

Figure 12:
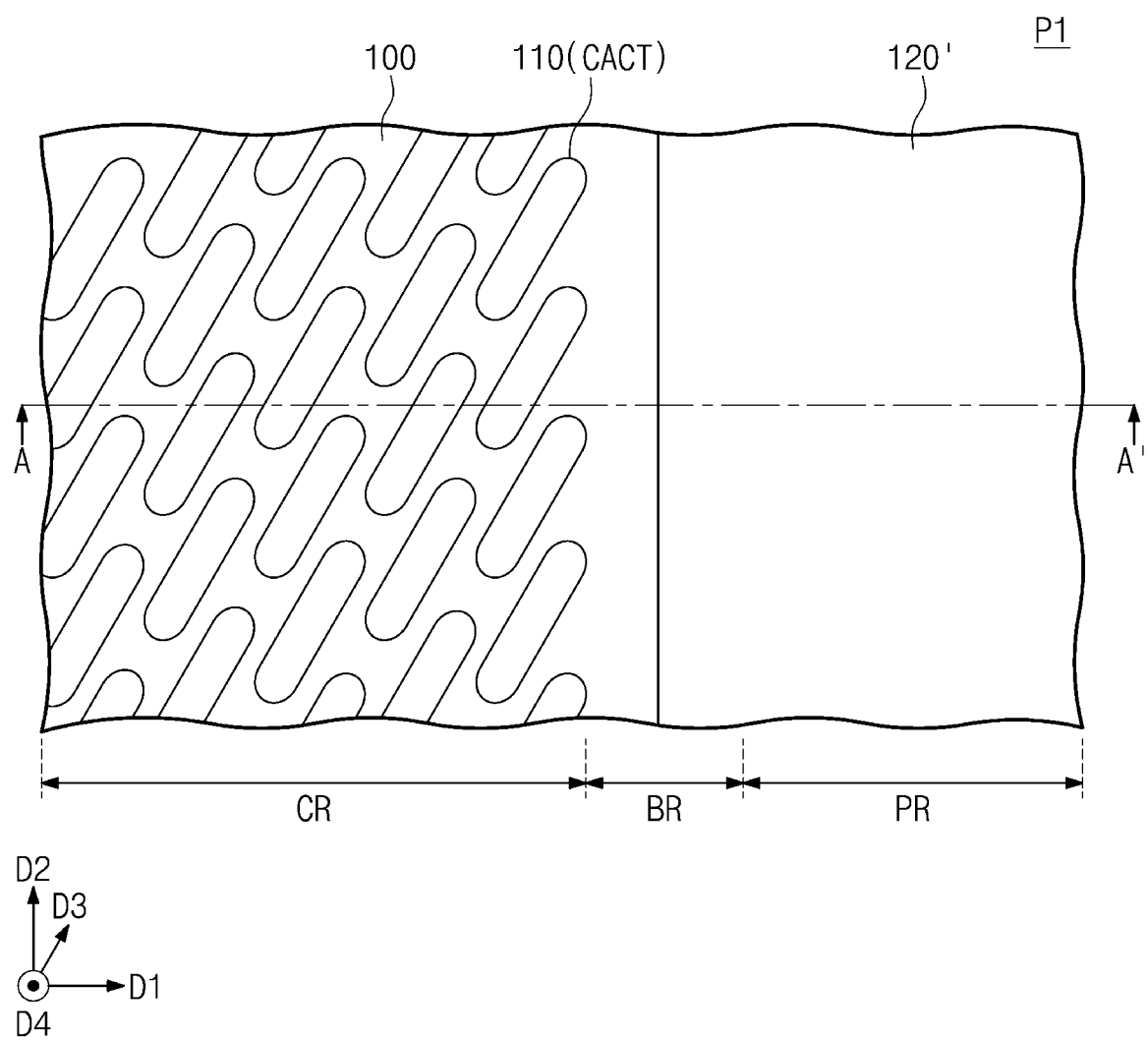
FIGS. 12 to 22 are diagrams illustrating stages in a method of fabricating a semiconductor device according to an embodiment.
Figure 13:
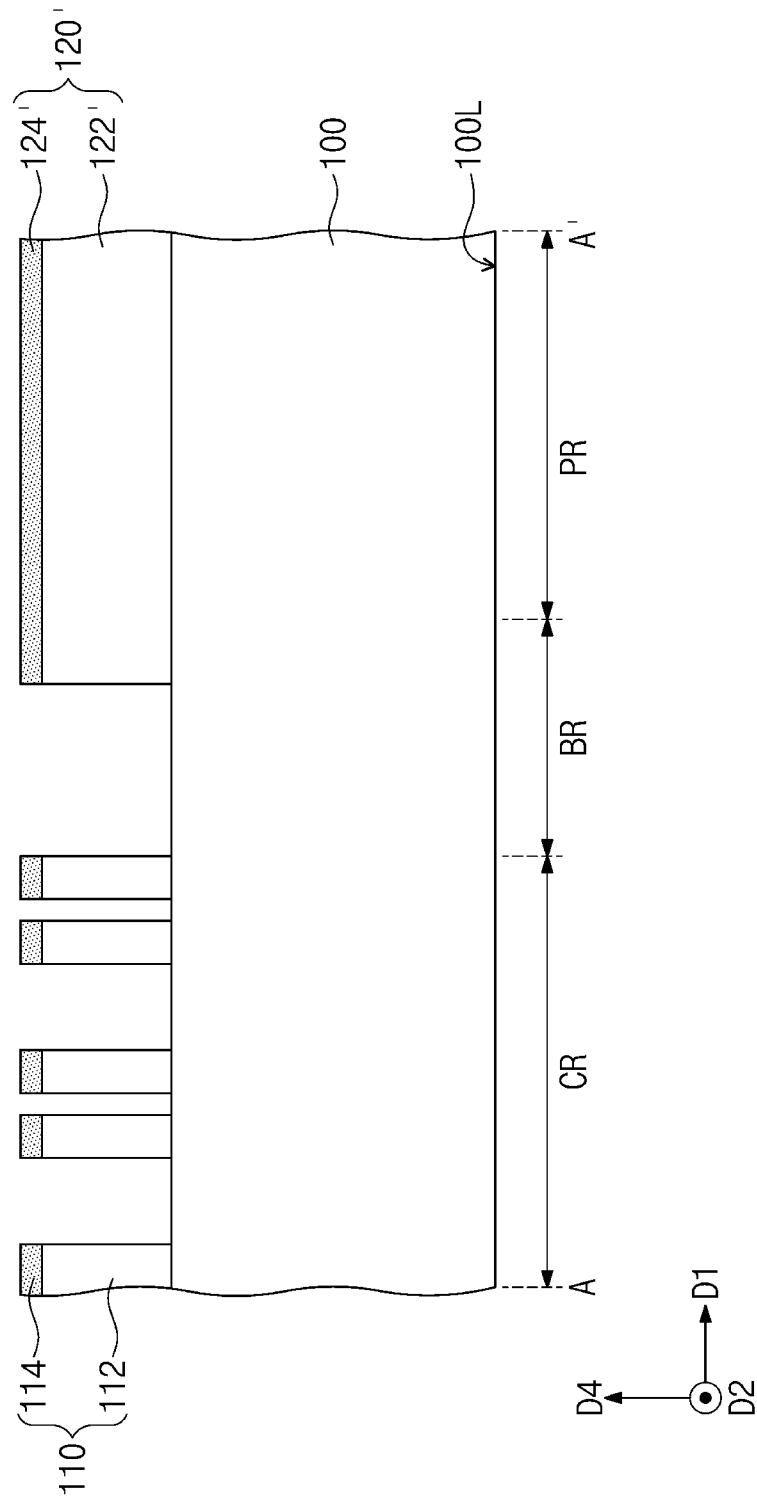
Figure 14:
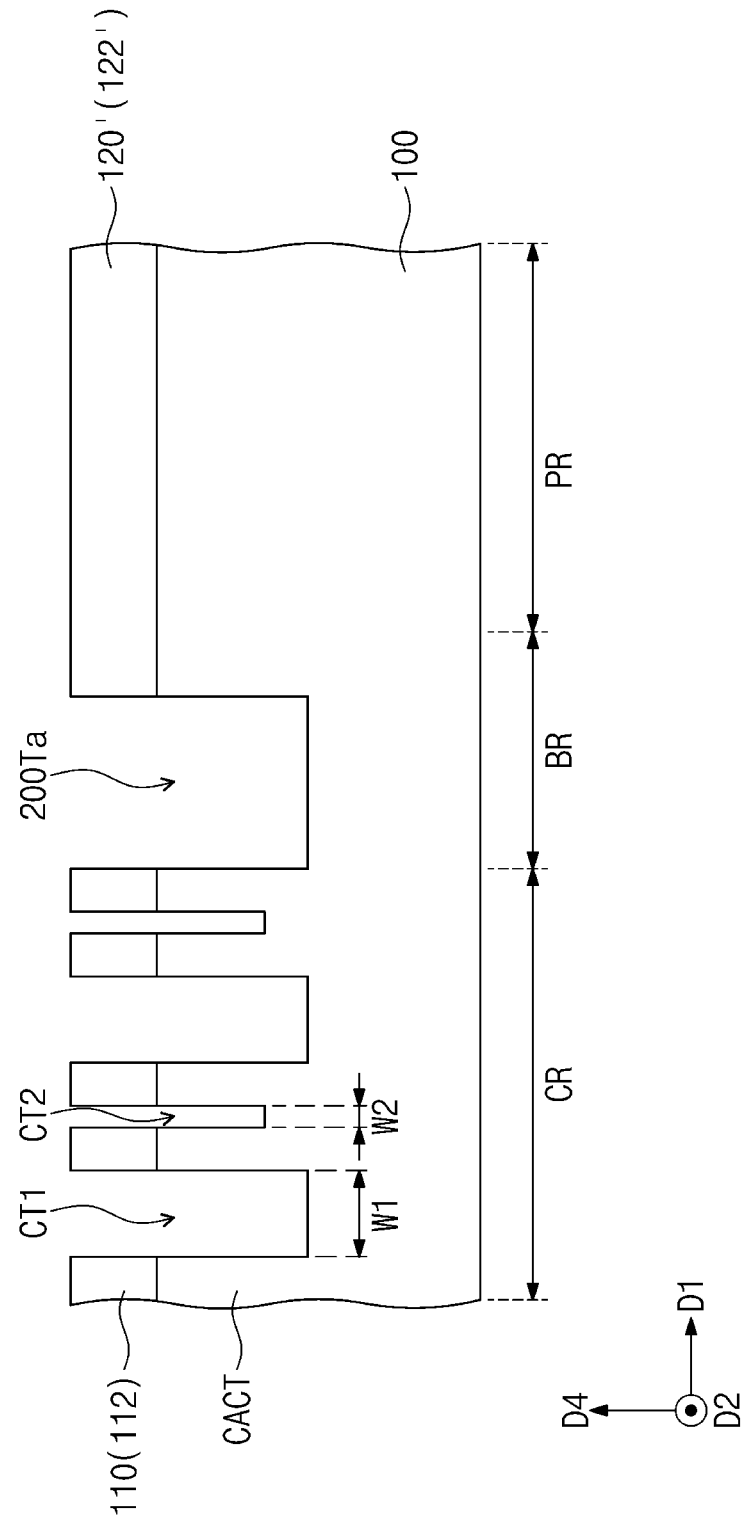
Figure 15:
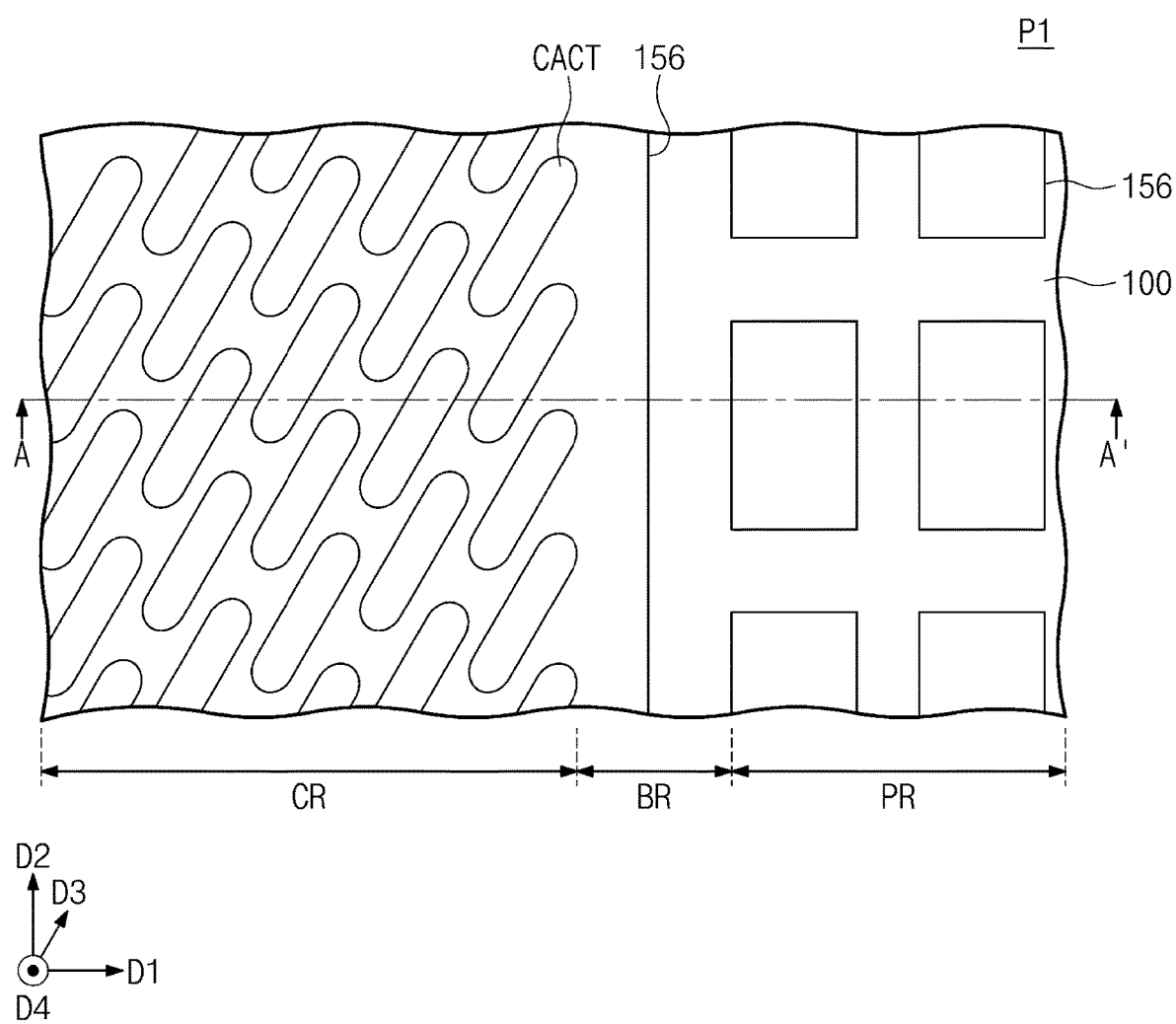
Figure 16:
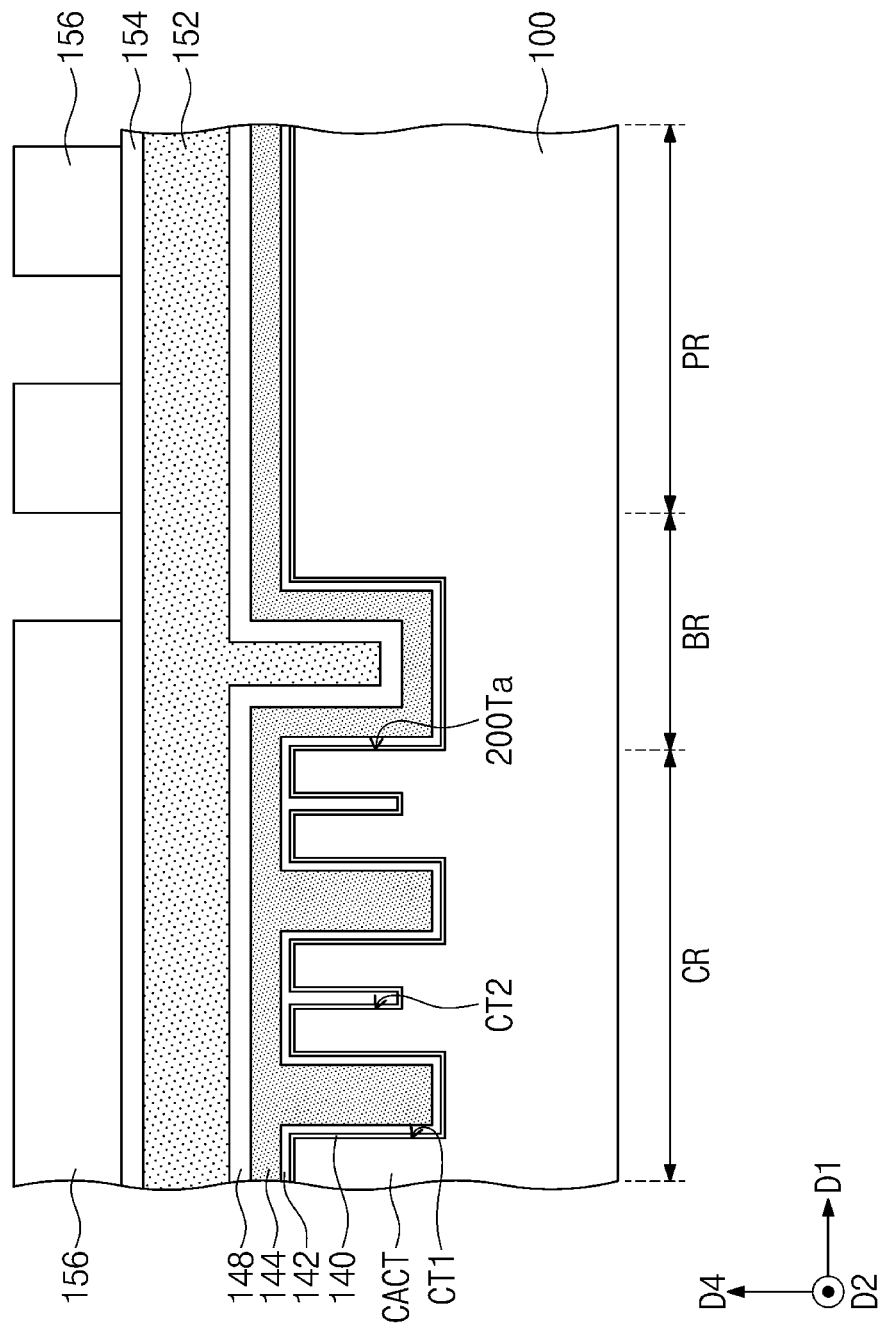
Figure 17:
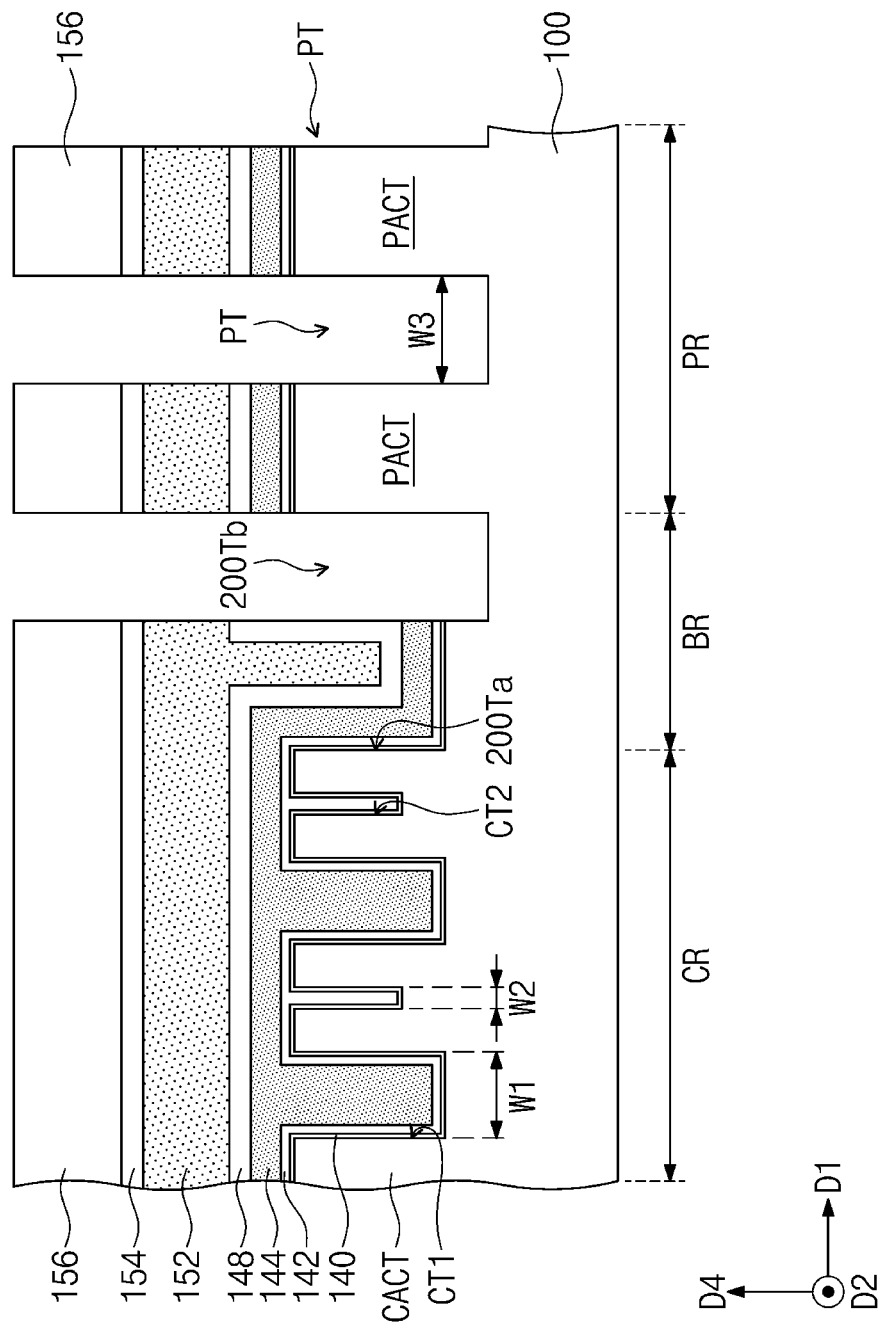
Figure 18:
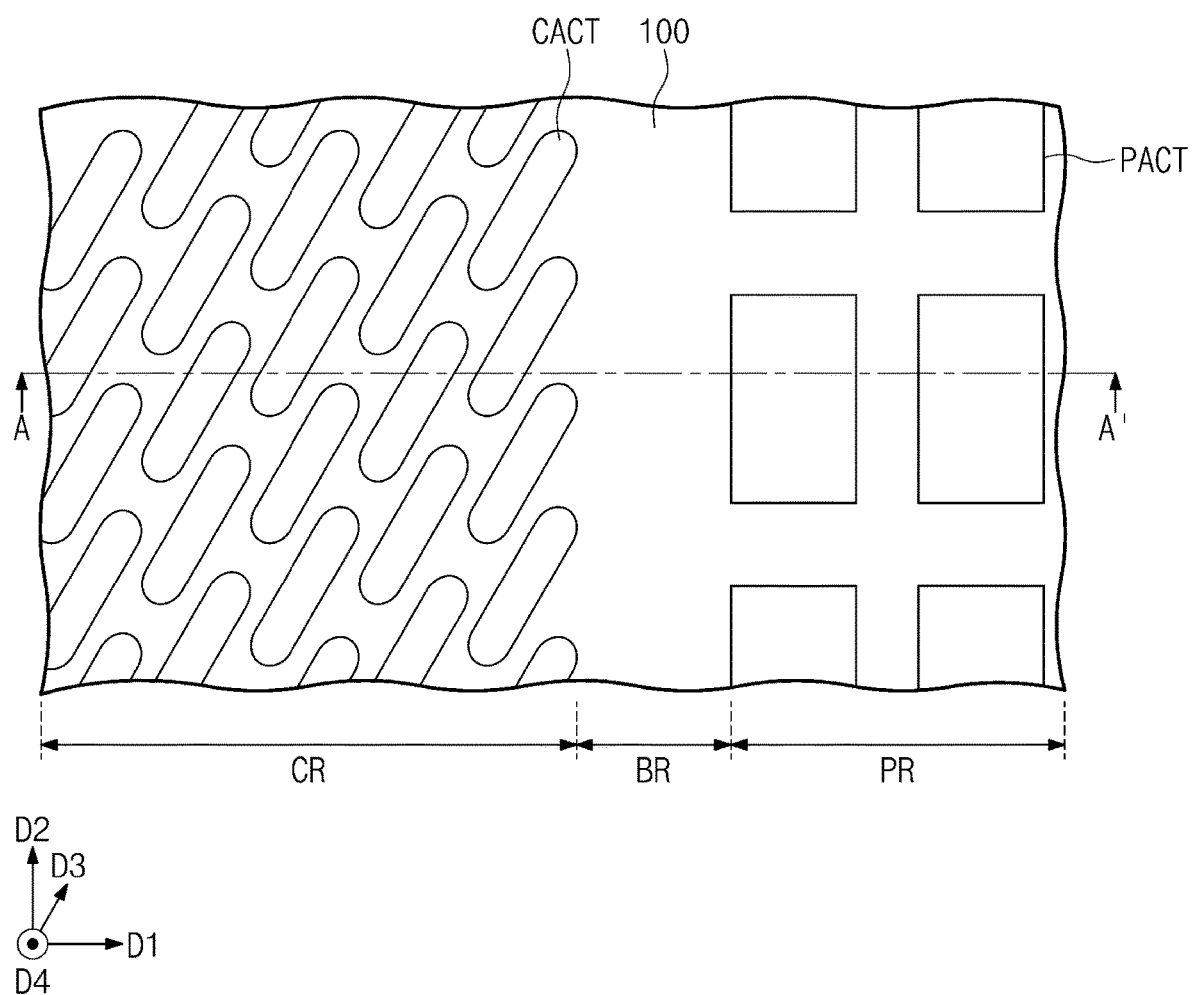

FIGS. 12 to 22 are diagrams illustrating a method of fabricating a semiconductor device according to an embodiment. In detail, FIGS. 12, 15, and 18 are plan views corresponding to portion P1 of FIG. 1, FIGS. 13 and 14 are sectional views corresponding to line A-A' of FIG. 12, FIGS. 16 and 17 are sectional views corresponding a line A-A' of FIG. 15, and FIGS. 19 to 22 are sectional views corresponding to line A-A' of FIG. 18. For the sake of brevity, features, which are different from the method described with reference to FIGS. 1 to 8, will be mainly described below.

Referring to FIGS. 12 and 13, the substrate 100 including the cell region CR, the peripheral region PR, and the boundary region BR therebetween may be provided. The cell mask patterns 110 and a peripheral mask pattern 120' may be formed on the substrate 100.

The cell mask patterns 110 may be formed on the cell region CR of the substrate 100. The cell mask patterns 110 may be spaced apart from each other in the first and second directions D1 and D2. Each of the cell mask patterns 110 may be a bar-shaped pattern elongated in the third direction D3, when viewed in a plan view. The cell mask patterns 110 may define regions, in which cell active patterns to be described below will be formed, in the substrate 100. Each of the cell mask patterns 110 may include the first cell mask pattern 112 and the second cell mask pattern 114, which are sequentially stacked on the substrate 100.

The peripheral mask pattern 120' may be formed on the peripheral region PR of the substrate 100 to cover the entire top surface of the peripheral region PR of the substrate 100. The peripheral mask pattern 120' may be extended to the boundary region BR of the substrate 100 to cover a portion of the boundary region BR. The peripheral mask pattern 120 may include a first peripheral mask pattern 122' and a second peripheral mask pattern 124', which are sequentially stacked on the substrate 100. The first cell mask pattern 112 and the first peripheral mask pattern 122' may be formed of or include the same material, and the second cell mask pattern 114 and the second peripheral mask pattern 124' may be formed of or include the same material.

Referring to FIGS. 12 and 14, a third etching process using the cell mask patterns 110 and the peripheral mask pattern 120 as an etch mask may be performed on the substrate 100. The third etching process may be performed to etch an upper portion of the substrate 100 and to form the cell trenches CT1 and CT2 and a first isolation trench 200Ta in the substrate 100.

The cell trenches CT1 and CT2 may be formed in the cell region CR of the substrate 100. The cell trenches CT1 and CT2 may include first cell trenches CT1 having the first width W1 and second cell trenches CT2 having the second width W2. Each of the first and second widths W1 and W2 may be widths measured in the first direction D1, and the first width W1 may be larger than the second width W2 (i.e., W1>W2). Due to an etch loading effect during the third etching process, the first cell trenches CT1 having the relatively large width W1 may be formed to be deeper in the substrate 100 than the second cell trenches CT2 having the relatively small width W2. The cell trenches CT1 and CT2 may define the cell active patterns CACT and may expose side surfaces of the cell active patterns CACT. Each of the cell active patterns CACT may be a bar-shaped pattern elongated in the third direction D3.

The first isolation trench 200Ta may be formed in the boundary region BR of the substrate 100. The first isolation trench 200Ta may be formed to be deeper in the substrate 100 than the second cell trenches CT2, and in an embodiment, the first isolation trench 200Ta may be formed to have substantially the same depth as the first cell trenches CT1. The second cell mask pattern 114 and the second peripheral mask pattern 124' may be removed during the third etching process.

Referring to FIGS. 15 and 16, the cell mask patterns 110 and the peripheral mask pattern 120' may be removed, after the formation of the cell trenches CT1 and CT2 and the first isolation trench 200Ta. The cell and peripheral mask patterns 110 and 120' may be removed by, e.g., a wet etching process. As a result of the removal of the cell and peripheral mask patterns 110 and 120', top surfaces of the cell active patterns CACT may be exposed, and a top surface of the substrate 100 may be exposed in the peripheral region PR and the boundary region BR.

The first oxide layer 140, the second oxide layer 142, the nitride layer 144, a first mask layer 148, a second mask layer 152, and a third mask layer 154 may be sequentially formed on the substrate 100 provided with the cell trenches CT1 and CT2 and the first isolation trench 200Ta. The first oxide layer 140 may be formed to conformally cover an inner surface of each of the cell trenches CT1 and CT2 and the first isolation trench 200Ta. The second oxide layer 142 may be formed to fill a portion of each of the first cell trenches CT1 and the first isolation trench 200Ta and to fill a remaining portion of each of the second cell trenches CT2. The nitride layer 144 may be formed to fill a remaining portion of each of the first cell trenches CT1 and to fill a portion of the first isolation trench 200Ta. The first mask layer 148 may be formed on the nitride layer 144 to fill a portion of the first isolation trench 200Ta, and the second mask layer 152 may be formed on the first mask layer 148 to fill a remaining portion of the first isolation trench 200Ta. The third mask layer 154 may be formed on the substrate 100 to cover the entire top surface of the second mask layer 152. The first mask layer 148 may be formed of or include at least one of, e.g., oxide materials. The second mask layer 152 may be formed of or include at least one organic compound having a carbon content that is equal to or higher than 80%. As an example, the second mask layer 152 may be a spin-on-hardmask (SOH) layer. The third mask layer 154 may be formed of or include, e.g., oxynitride.

Photoresist patterns 156 may be formed on the third mask layer 154. The photoresist patterns 156 may be formed to fully cover the cell region CR of the substrate 100 and to partially cover the boundary region BR of the substrate 100, e.g., the photoresist patterns 156 may only partially cover a top of the first isolation trench 200Ta. The photoresist patterns 156 may define regions, on which peripheral active patterns to be described below will be formed, in the peripheral region PR of the substrate 100. The photoresist patterns 156 may be referred to as mask patterns.

Referring to FIGS. 15 and 17, a fourth etching process using the photoresist patterns 156 as an etch mask may be performed on the substrate 100. The fourth etching process may be performed to sequentially etch the third mask layer 154, the second mask layer 152, the first mask layer 148, the nitride layer 144, the second oxide layer 142, and the first oxide layer 140 and to etch an upper portion of the substrate 100. Accordingly, peripheral trenches PT and a second isolation trench 200Tb may be formed in the substrate 100.

The peripheral trenches PT may be formed in the peripheral region PR of the substrate 100. The peripheral trenches PT may have the third width W3 in the first direction D1, which may be larger than each of the first and second widths W1 and W2 of the cell trenches CT1 and CT2. Due to the etch loading effect during the fourth etching process, the peripheral trenches PT having the relatively large width W3 may be formed to be deeper in the substrate 100 than the cell trenches CT1 and CT2 having the relatively small widths W1 and W2. The peripheral trenches PT may be formed to be deeper in the substrate 100 than the first isolation trench 200Ta. The peripheral trenches PT may define peripheral active patterns PACT and may expose side surfaces of the peripheral active patterns PACT. Each of the peripheral active patterns PACT may be a plate-shaped pattern, when viewed in a plan view, but embodiments are not limited to this example.

The second isolation trench 200Tb may be formed in the boundary region BR of the substrate 100, e.g., the second isolation trench 200Tb may be formed in the boundary region BR to extend through a portion of the first isolation trench 200Ta that is adjacent the peripheral region PR. The second isolation trench 200Tb may be formed to be deeper in the substrate 100 than the cell trenches CT1 and CT2, and may be formed to have substantially a same depth as the peripheral trenches PT.

Figure 19:
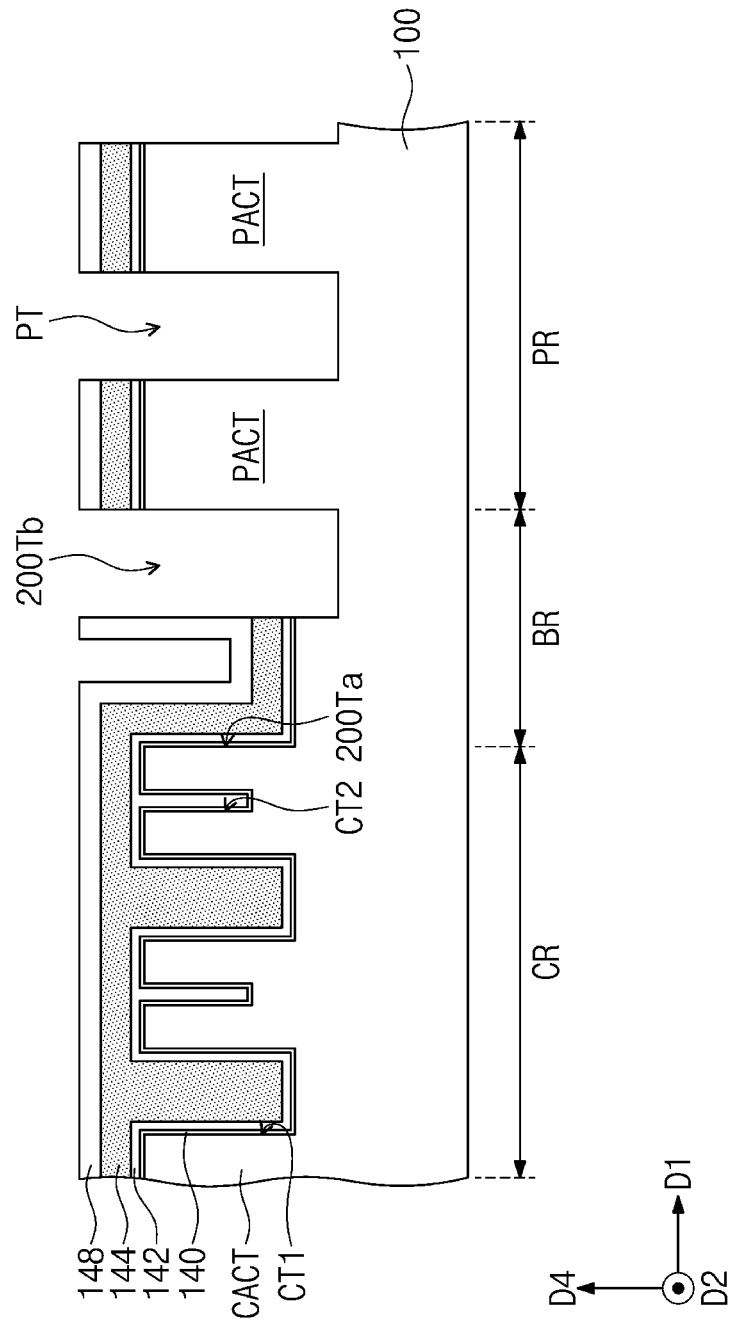

Referring to FIGS. 18 and 19, the photoresist patterns 156, the third mask layer 154, and the second mask layer 152 may be removed, after the formation of the peripheral trenches PT and the second isolation trench 200Tb. The photoresist patterns 156, the third mask layer 154, and the second mask layer 152 may be removed by, e.g., an ashing and/or strip process.

Figure 20:
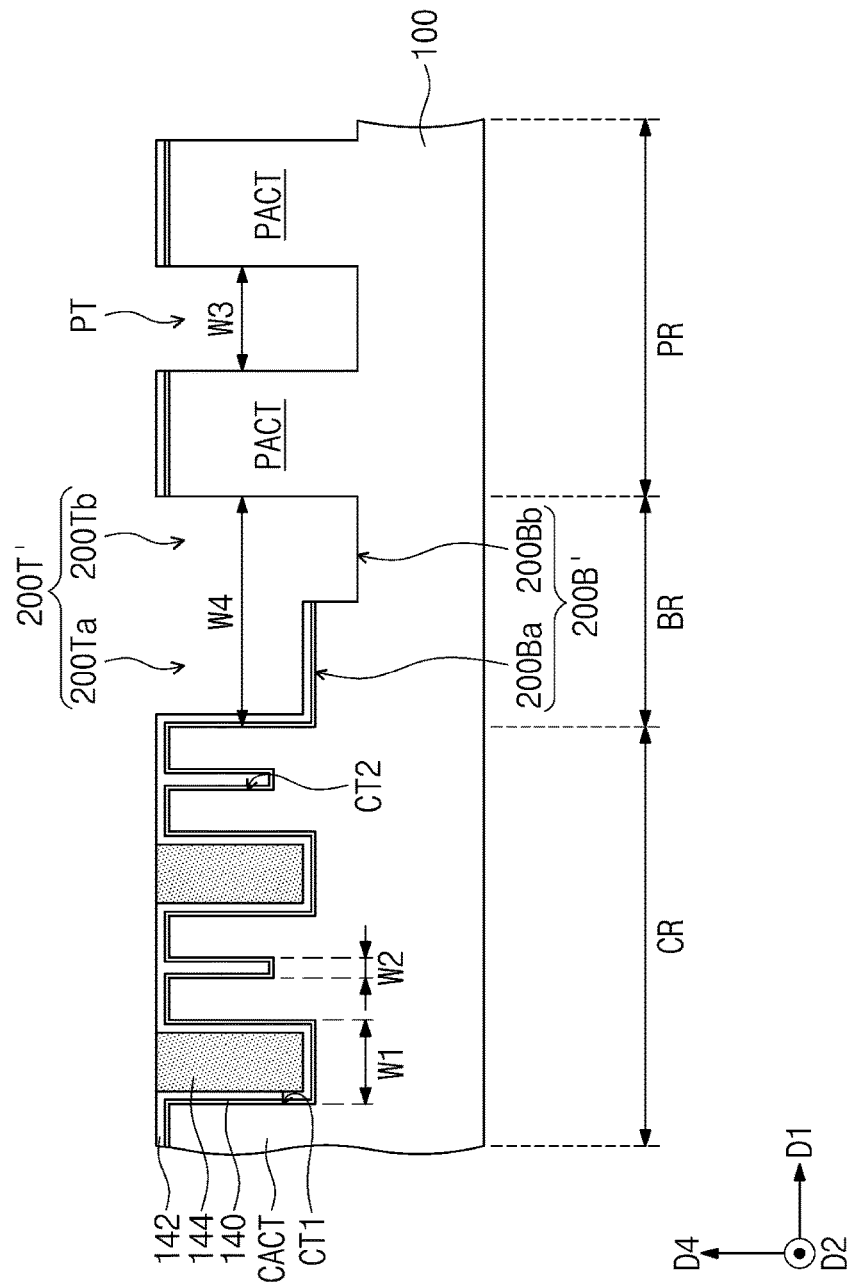

Referring to FIGS. 18 and 20, the first mask layer 148 may be removed. The first mask layer 148 may be removed by, e.g., a wet etching process. Thereafter, the nitride layer 144 may be removed from the peripheral region PR and the boundary region BR. That is, the nitride layer 144 on the peripheral active patterns PACT and the nitride layer 144 in the first isolation trench 200Ta may be removed. In addition, a portion of the nitride layer 144 may be removed from the cell region CR, but a portion of the nitride layer 144 may be locally left in the first cell trenches CT1. The nitride layer 144 may be removed by, e.g., a dry etching process.

The first isolation trench 200Ta and the second isolation trench 200Tb may be connected to each other to form a single trench, e.g., the first isolation trench 200Ta and the second isolation trench 200Tb may be in fluid communication with each other, which will be referred to as an isolation trench 200T'. The isolation trench 200T' may be formed in the boundary region BR of the substrate 100 and between the cell active patterns CACT and the peripheral active patterns PACT. The isolation trench 200T' may be interposed between a corresponding one of the cell active patterns CACT and a corresponding one of the peripheral active patterns PACT, and may expose a side surface of the corresponding cell active pattern CACT and a side surface of the corresponding peripheral active pattern PACT. The isolation trench 200T' may have a fourth width W4 in the first direction D1, which may be larger than each of the first and second widths W1 and W2 of the cell trenches CT1 and CT2, and larger than the third width W3 of the peripheral trenches PT. The fourth width W4 in the first direction D1 may be measured between facing sidewalls of the isolation trench 200T' in a widest region of isolation trench 200T'.

Since the second isolation trench 200Tb is formed to be deeper in the substrate 100 than the first isolation trench 200Ta, a bottom surface 200B' of the isolation trench 200T' may have a stepwise profile. The bottom surface 200B' of the isolation trench 200T' may include a first portion 200Ba adjacent to a side surface of the corresponding cell active pattern CACT and a second portion 200Bb adjacent to a side surface of the corresponding peripheral active pattern PACT, and a height of the second portion 200Bb may be lower than a height of the first portion 200Ba.

Figure 21:
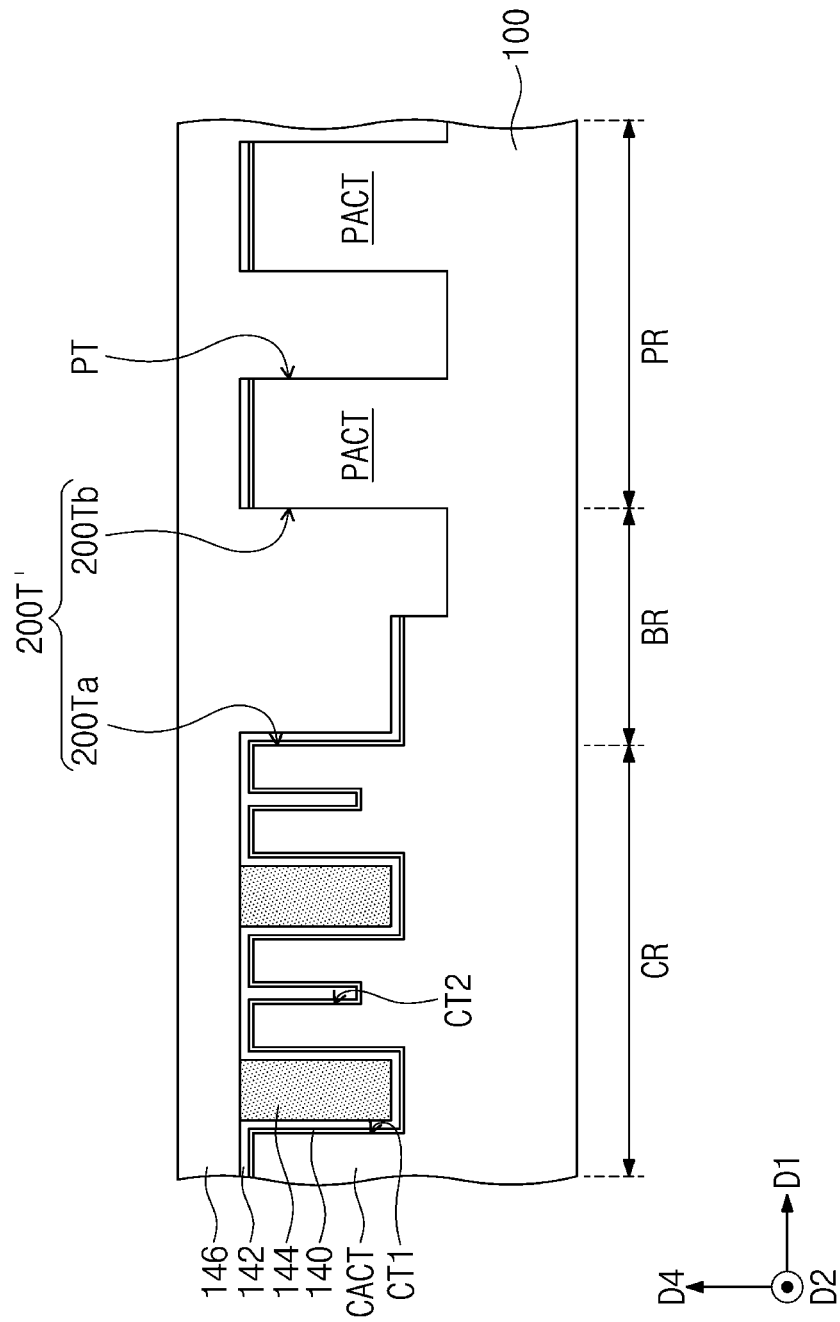

Referring to FIGS. 18 and 21, a third oxide layer 146 may be formed on the substrate 100 to fill the isolation trench 200T' and the peripheral trenches PT. In some embodiments, a portion of each of the first and second oxide layers 140 and 142 may be interposed between an inner surface of the isolation trench 200T' (i.e., the first isolation trench 200Ta) and the third oxide layer 146.

Figure 22:
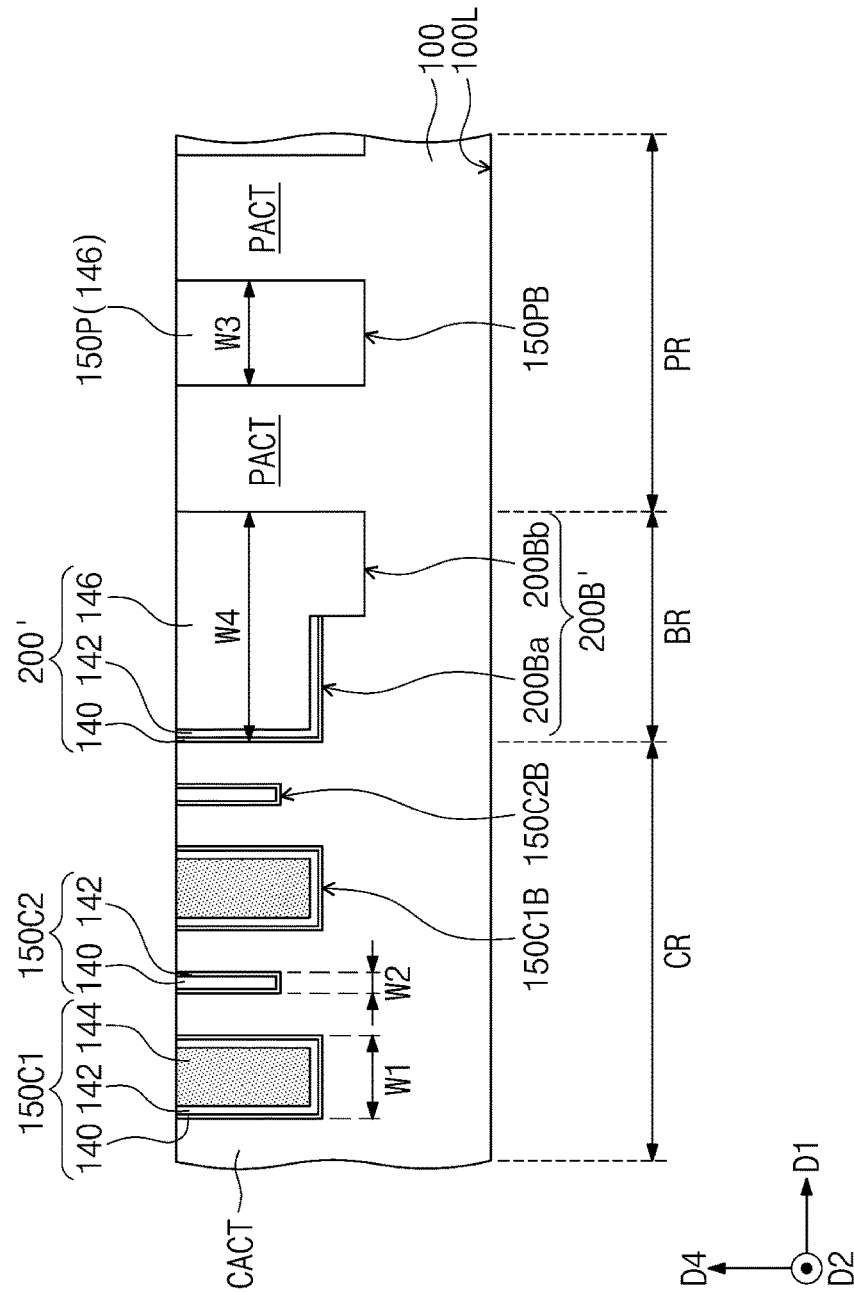

Referring to FIGS. 18 and 22, a planarization process may be performed on the third oxide layer 146. The planarization process may be performed until the top surfaces of the cell active patterns CACT and the peripheral active patterns PACT are exposed to the outside. As a result of the planarization process, cell device isolation patterns 150C1 and 150C2, peripheral device isolation patterns 150P, and an insulating isolation pattern 200' may be locally formed in the cell trenches CT1 and CT2, the peripheral trenches PT, and the isolation trench 200T', respectively.

The cell device isolation patterns 150C1 and 150C2 may include first cell device isolation patterns 150C1 in the first cell trenches CT1 and second cell device isolation patterns 150C2 in the second cell trenches CT2. Each of the first cell device isolation patterns 150C1 may include the first oxide layer 140, the second oxide layer 142, and the nitride layer 144. Each of the second cell device isolation patterns 150C2 may include the first and second oxide layers 140 and 142, but may not include the nitride layer 144. The insulating isolation pattern 200' may include the first oxide layer 140, the second oxide layer 142, and the third oxide layer 146 but may not include the nitride layer 144. The peripheral device isolation patterns 150P may include the third oxide layer 146 but may not include the nitride layer 144.

The first cell device isolation patterns 150C1 may have the first width W1, and the second cell device isolation patterns 150C2 may have the second width W2. The first width W1 may be larger than the second width W2 (i.e., W1>W2). Since, as described with reference to FIGS. 12 and 14, the first cell trenches CT1 are formed to be deeper in the substrate 100 than the second cell trenches CT2, the bottom surface 150C1B of each of the first cell device isolation patterns 150C1 may be located at a height lower than a bottom surface 150C2B of each of the second cell device isolation patterns 150C2, when measured from the bottom surface 100L of the substrate 100.

The peripheral device isolation patterns 150P may have the third width W3, which is larger than the first and second widths W1 and W2 of the cell device isolation patterns 150C1 and 150C2. Since, as described with reference to FIGS. 15 and 17, the peripheral trenches PT are formed to be deeper in the substrate 100 than the cell trenches CT1 and CT2, the bottom surface 150PB of each of the peripheral device isolation patterns 150P may be located at a height lower than the bottom surfaces 150C1B and 150C2B of the cell device isolation patterns 150C1 and 150C2, when measured from the bottom surface 100L of the substrate 100.

The insulating isolation pattern 200' may have the fourth width W4, which may be larger than the third width W3 of the peripheral device isolation patterns 150P. Since, as described with reference to FIGS. 18 and 20, the second isolation trench 200Tb is formed to be deeper in the substrate 100 than the first isolation trench 200Ta, the bottom surface 200B' of the insulating isolation pattern 200' may have a stepwise profile. The bottom surface 200B' of the insulating isolation pattern 200' may correspond to the bottom surface 200B' of the isolation trench 200T'. The bottom surface 200B' of the insulating isolation pattern 200' may include a first portion 200Ba adjacent to a side surface of the corresponding cell active pattern CACT and a second portion 200Bb adjacent to a side surface of the corresponding peripheral active pattern PACT, and a height of the second portion 200Bb may be lower than a height of the first portion 200Ba. The first portion 200Ba of the bottom surface 200B' of the insulating isolation pattern 200' may be located at substantially the same height as the bottom surface 150C1B of each of the first cell device isolation patterns 150C1, and the second portion 200Bb of the bottom surface 200B' of the insulating isolation pattern 200' may be located at substantially the same height as the bottom surface 150PB of each of the peripheral device isolation patterns 150P.

According to an embodiment, the cell trenches CT1 and CT2 may be formed by the third etching process, and the peripheral trenches PT may be formed by the fourth etching process different from the third etching process, i.e., two separate etching processes. That is, since the cell trenches CT1 and CT2 and the peripheral trenches PT are formed through separate etching processes, it may be possible to easily form the cell trenches CT1 and CT2 to the specific depth required for the electric isolation between adjacent cell transistors, and to easily form the peripheral trenches PT to a depth capable of preventing crystal defect issues (e.g., silicon dislocation) from occurring in the peripheral active patterns PACT. Accordingly, it may be possible to easily fabricate a semiconductor device with improved electric characteristics.

In addition, the first isolation trench 200Ta may be formed concurrently, e.g., simultaneously, with the cell trenches CT1 and CT2 by the third etching process, and the second isolation trench 200Tb may be formed concurrently, e.g., simultaneously, with the peripheral trenches PT by the fourth etching process. Thus, the bottom surface 200B' of the isolation trench 200T' in the boundary region BR may include the first portion 200Ba and the second portion 200Bb, which are respectively located adjacent to side surfaces of the corresponding cell active pattern CACT and the corresponding peripheral active pattern PACT, and a height of the second portion 200Bb may be lower than a height of the first portion 200Ba.

Figure 23:
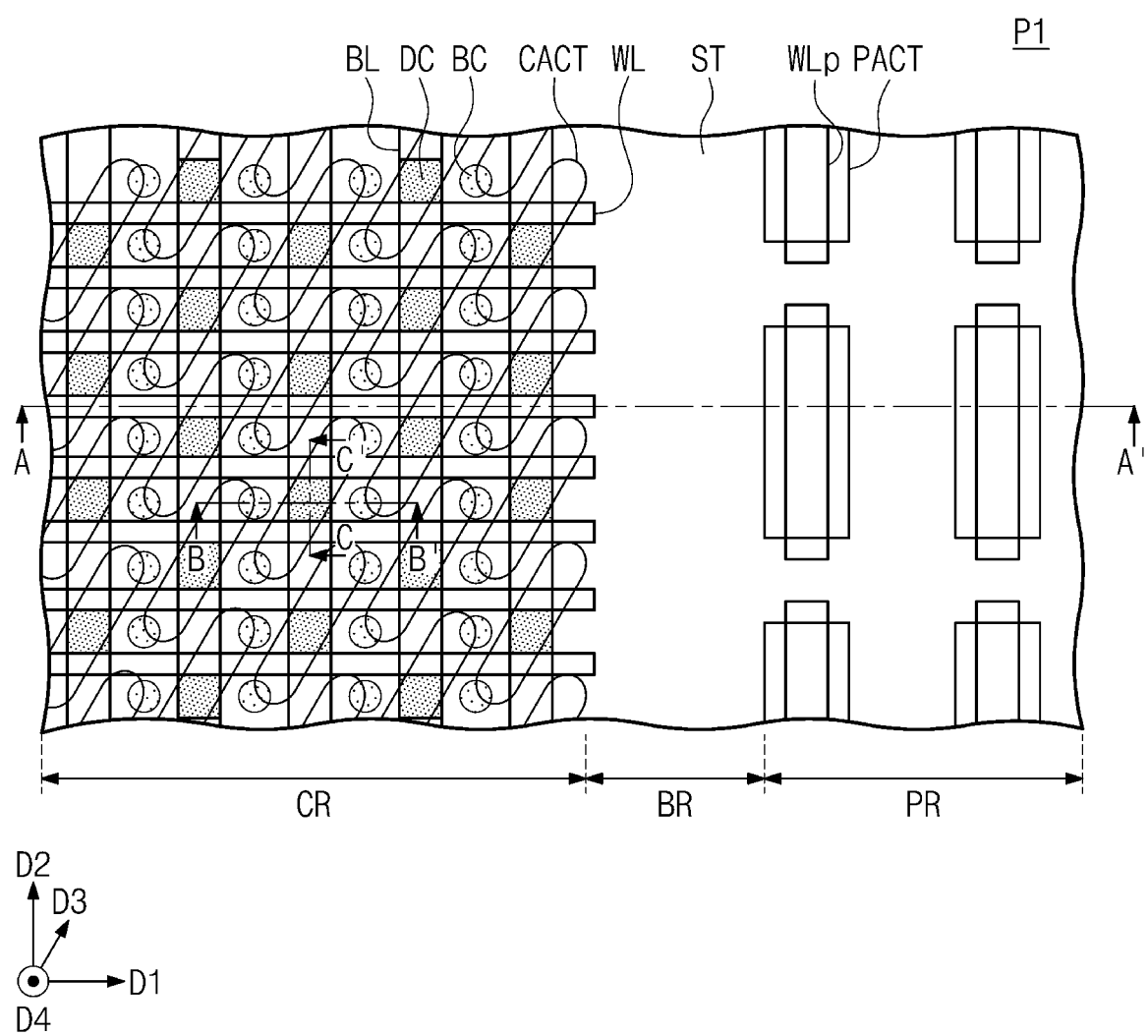
FIG. 23 is a plan view illustrating a semiconductor device according to an embodiment.
Figure 24:
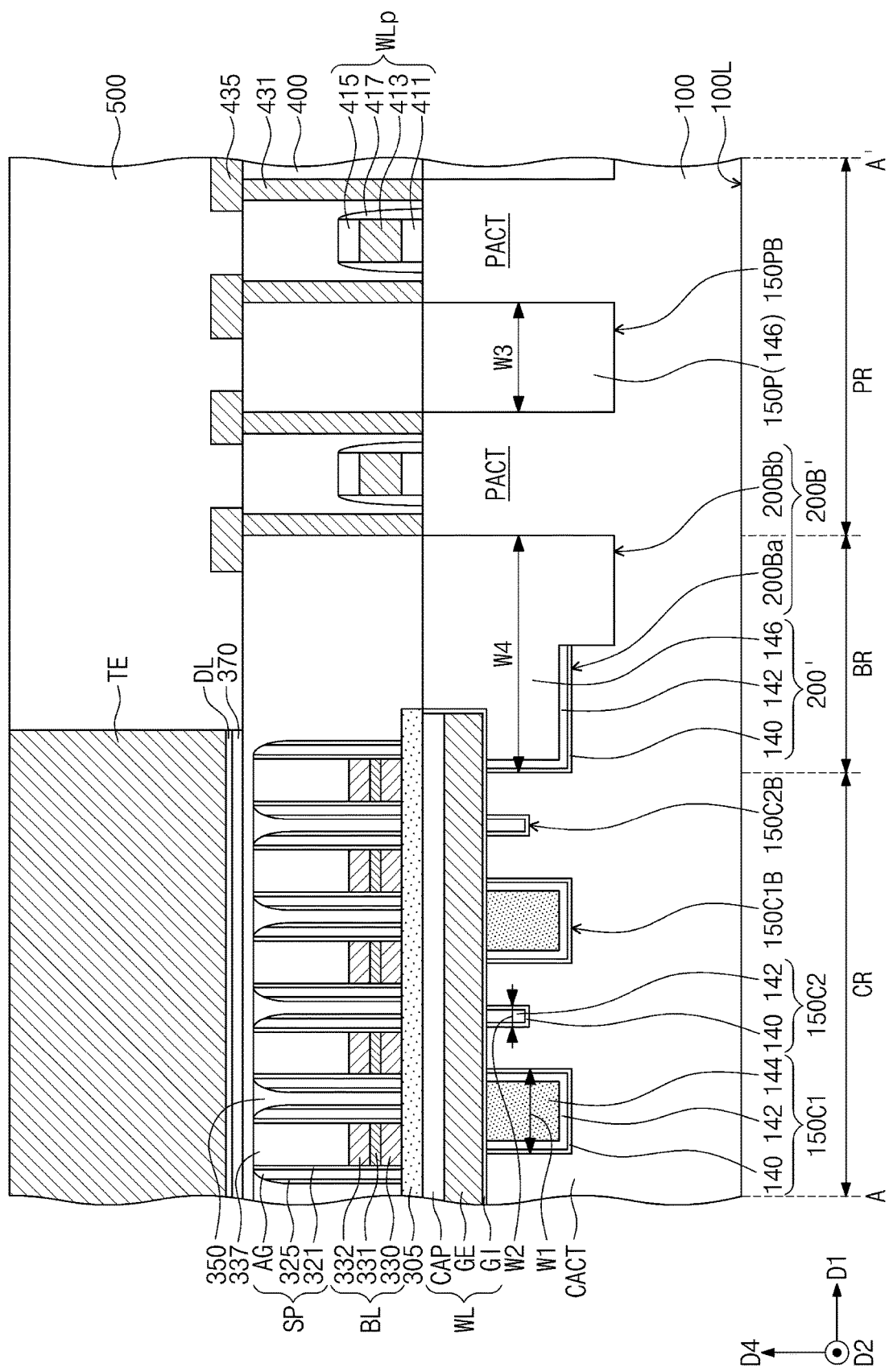
FIG. 24 is a sectional view taken along line A-A' of FIG. 23.

FIG. 23 is a plan view illustrating a semiconductor device according to an embodiment, and FIG. 24 is a sectional view taken along line A-A' of FIG. 23. Sectional views taken along lines B-B' and C-C' of FIG. 23 may be substantially the same as those in FIG. 11. For the sake of brevity, features, which are different from the semiconductor device described with reference to FIGS. 9 to 11, will be mainly described below.

Referring to FIGS. 23 and 24, the cell device isolation patterns 150C1 and 150C2 may be formed in the cell region CR of the substrate 100 to define the cell active patterns CACT. The cell device isolation patterns 150C1 and 150C2 may include the first cell device isolation patterns 150C1 having the first width W1 and the second cell device isolation patterns 150C2 having the second width W2. The first width W1 may be larger than the second width W2 (i.e., W1>W2). The bottom surface 150C1B of each of the first cell device isolation patterns 150C1 may be positioned at a height lower than the bottom surface 150C2B of each of the second cell device isolation patterns 150C2, when measured from the bottom surface 100L of the substrate 100.

The peripheral device isolation patterns 150P may be disposed in the peripheral region PR of the substrate 100 to define the peripheral active patterns PACT. The peripheral device isolation patterns 150P may have the third width W3, which may be larger than the first width W1 of the first cell device isolation patterns 150C1 and the second width W2 of the second cell device isolation patterns 150C2. The bottom surface 150PB of each of the peripheral device isolation patterns 150P may be located at a height lower than the bottom surface 150C1B of each of the first cell device isolation patterns 150C1 and the bottom surface 150C2B of each of the second cell device isolation patterns 150C2, when measured from the bottom surface 100L of the substrate 100.

The insulating isolation pattern 200' may be disposed in the boundary region BR of the substrate 100. The insulating isolation pattern 200' may be disposed between the cell active patterns CACT and the peripheral active patterns PACT. The insulating isolation pattern 200' may be interposed between a corresponding one of the cell active patterns CACT and a corresponding one of the peripheral active patterns PACT. The bottom surface 200B' of the insulating isolation pattern 200' may have a stepwise profile. The bottom surface 200B' of the insulating isolation pattern 200' may include the first portion 200Ba adjacent to a side surface of the corresponding cell active pattern CACT and the second portion 200Bb adjacent to a side surface of the corresponding peripheral active pattern PACT. A height of the second portion 200Bb may be lower than a height of the first portion 200Ba. The first portion 200Ba of the bottom surface 200B of the insulating isolation pattern 200' may be located at substantially the same height as the bottom surface 150C1B of each of the first cell device isolation patterns 150C1, and the second portion 200Bb of the bottom surface 200B of the insulating isolation pattern 200 may be located at substantially the same height as the bottom surface 150PB of each of the peripheral device isolation patterns 150P.

The cell device isolation patterns 150C1 and 150C2, the peripheral device isolation patterns 150P, and the insulating isolation pattern 200' may be formed by the method described with reference to FIGS. 12 to 22. The cell device isolation patterns 150C1 and 150C2, the peripheral device isolation patterns 150P, and the insulating isolation pattern 200' may be connected to each other to form a single device isolation layer ST.

Except for the afore-described differences, the semiconductor device according to the present embodiment may be substantially the same as the semiconductor device described with reference to FIGS. 9 to 11.

By way of summation and review, to meet an increasing demand for a semiconductor device with a small pattern size and a reduced design rule, transistors are being scaled down. To prevent the electric characteristics of the transistors from being deteriorated by the scale down thereof, it is necessary to form the cell and peripheral device isolation patterns to specific depths.

Therefore, embodiment provide a semiconductor device with improved electric characteristics and a method of fabricating the same. That is, according to an embodiment, it may be possible to reduce an etch loading effect in an etching process to form cell trenches and peripheral trenches, and thereby to easily control depths of cell and peripheral device isolation patterns. Accordingly, it may be possible to easily fabricate a semiconductor device with improved electric characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate including a cell region, a peripheral region, and a boundary region between the cell region and the peripheral region;
    a cell device isolation pattern on the cell region of the substrate to define cell active patterns;
    a peripheral device isolation pattern on the peripheral region of the substrate to define peripheral active patterns; and
    an insulating isolation pattern on the boundary region of the substrate, the insulating isolation pattern being between the cell active patterns and the peripheral active patterns,
    wherein a bottom surface of the insulating isolation pattern includes:
        a first edge adjacent to a side surface of a corresponding one of the cell active patterns, and
        a second edge adjacent to a side surface of a corresponding one of the peripheral active patterns, the first edge being at a height lower than the second edge, when measured from a bottom surface of the substrate, and the bottom surface being continuously sloped from the first edge to the second edge.

2. The semiconductor device as claimed in claim 1, wherein:
    each of the cell device isolation pattern, the peripheral device isolation pattern, and the insulating isolation pattern has a width in a first direction, the first direction being parallel to the bottom surface of the substrate,
    the width of the peripheral device isolation pattern is larger than the width of the cell device isolation pattern, and
    the width of the insulating isolation pattern is larger than the width of the peripheral device isolation pattern.

3. The semiconductor device as claimed in claim 2, wherein a height of the bottom surface of the insulating isolation pattern is gradually lowered from the second edge toward the first edge.

4. The semiconductor device as claimed in claim 1, wherein the second edge of the bottom surface of the insulating isolation pattern is at a height lower than a bottom surface of the cell device isolation pattern, when measured from the bottom surface of the substrate.

5. The semiconductor device as claimed in claim 4, wherein:
the cell device isolation pattern includes a first cell device isolation pattern and a second cell device isolation pattern,
each of the first cell device isolation pattern and the second cell device isolation pattern is between adjacent ones of the cell active patterns, and
a bottom surface of the first cell device isolation pattern is at a height lower than a bottom surface of the second cell device isolation pattern, and is at a height higher than the second edge of the bottom surface of the insulating isolation pattern, when measured from the bottom surface of the substrate.

6. The semiconductor device as claimed in claim 5, wherein each of the first cell device isolation pattern and the second cell device isolation pattern has a width in a first direction that is parallel to the bottom surface of the substrate, the width of the first cell device isolation pattern being larger than the width of the second cell device isolation pattern.

7. The semiconductor device as claimed in claim 4, wherein the first edge of the bottom surface of the insulating isolation pattern is at a height lower than a bottom surface of the peripheral device isolation pattern, when measured from the bottom surface of the substrate.

8. The semiconductor device as claimed in claim 7, wherein the second edge of the bottom surface of the insulating isolation pattern is at a same height as the bottom surface of the peripheral device isolation pattern, when measured from the bottom surface of the substrate.

9. The semiconductor device as claimed in claim 1, wherein the first edge of the bottom surface of the insulating isolation pattern is at a height lower than a bottom surface of the cell device isolation pattern and lower than a bottom surface of the peripheral device isolation pattern, when measured from the bottom surface of the substrate.

10. The semiconductor device as claimed in claim 9, wherein a height of the bottom surface of the insulating isolation pattern is gradually lowered from the second edge toward the first edge.

11. A semiconductor device, comprising:
a substrate including a cell region, a peripheral region, and a boundary region between the cell region and the peripheral region;
cell active patterns on the cell region of the substrate to protrude from the substrate;
peripheral active patterns on the peripheral region of the substrate to protrude from the substrate; and
an insulating isolation pattern on the boundary region of the substrate, the insulating isolation pattern being between the cell active patterns and the peripheral active patterns,
wherein the insulating isolation pattern is between a corresponding one of the cell active patterns and a corresponding one of the peripheral active patterns,
wherein a bottom surface of the insulating isolation pattern includes a first edge adjacent to a side surface of the corresponding cell active pattern and a second edge adjacent to a side surface of the corresponding peripheral active pattern,
wherein a height of the bottom surface of the insulating isolation pattern is lowered with decreasing distance to the first edge, when measured from a bottom surface of the substrate, and
wherein the first edge of the bottom surface of the insulating isolation pattern is at a height lower than a bottom surface of a cell device isolation pattern and lower than a bottom surface of a peripheral device isolation pattern, when measured from the bottom surface of the substrate.

12. The semiconductor device as claimed in claim 11, wherein the height of the bottom surface of the insulating isolation pattern is increased with decreasing distance to the second edge, when measured from the bottom surface of the substrate.

13. The semiconductor device as claimed in claim 11, further comprising the cell device isolation pattern between the cell active patterns, the second edge of the bottom surface of the insulating isolation pattern being at a height lower than the bottom surface of the cell device isolation pattern, when measured from the bottom surface of the substrate.

14. The semiconductor device as claimed in claim 13, wherein the first edge of the bottom surface of the insulating isolation pattern is at a height lower than the second edge, when measured from the bottom surface of the substrate.

15. The semiconductor device as claimed in claim 13, further comprising the peripheral device isolation pattern between the peripheral active patterns, the first edge of the bottom surface of the insulating isolation pattern being at a height lower than the bottom surface of the peripheral device isolation pattern, when measured from the bottom surface of the substrate.

16. The semiconductor device as claimed in claim 15, wherein the bottom surface of the peripheral device isolation pattern is at a height lower than the bottom surface of the cell device isolation pattern, when measured from the bottom surface of the substrate.

17. The semiconductor device as claimed in claim 11, further comprising:
the cell device isolation pattern between the cell active patterns; and
the peripheral device isolation pattern between the peripheral active patterns.

18. The semiconductor device as claimed in claim 17, wherein:
each of the cell device isolation pattern, the peripheral device isolation pattern, and the insulating isolation pattern has a width in a first direction that is parallel to the bottom surface of the substrate,
the width of the peripheral device isolation pattern is larger than the width of the cell device isolation pattern, and
the width of the insulating isolation pattern is larger than the width of the peripheral device isolation pattern.

19. A semiconductor device, comprising:
a substrate including a cell region, a peripheral region, and a boundary region between the cell region and the peripheral region;
a cell device isolation pattern on the cell region of the substrate to define cell active patterns;
a peripheral device isolation pattern on the peripheral region of the substrate to define peripheral active patterns; and an insulating isolation pattern on the boundary region of the substrate and between the cell active patterns and the peripheral active patterns, wherein the cell device isolation pattern includes a first cell device isolation pattern having a first width and a second cell device isolation pattern having a second width smaller than the second width, wherein a bottom surface of the insulating isolation pattern includes a first portion adjacent to the cell active patterns and a second portion adjacent to the peripheral active patterns, the second portion being at a height lower than the first portion, when measured from a bottom surface of the substrate, and wherein a bottom surface of the first cell device isolation pattern is at a height lower than a bottom surface of the second cell device isolation pattern and is at a height higher than the second portion of the bottom surface of the insulating isolation pattern, when measured from the bottom surface of the substrate.

20. The semiconductor device as claimed in claim 19, wherein:

the first portion of the bottom surface of the insulating isolation pattern is at a substantially same height as the bottom surface of the first cell device isolation pattern, when measured from the bottom surface of the substrate, and the second portion of the bottom surface of the insulating isolation pattern is at a substantially same height as a bottom surface of the peripheral device isolation pattern, when measured from the bottom surface of the substrate.

* * * * *